US011316313B2

(12) United States Patent
Hachuda et al.

(10) Patent No.: US 11,316,313 B2
(45) Date of Patent: Apr. 26, 2022

(54) OPENING/CLOSING MECHANISM OF OPENING/CLOSING BODY

(71) Applicant: ENPLAS CORPORATION, Kawaguchi (JP)

(72) Inventors: Osamu Hachuda, Kawaguchi (JP); Shin Kobayashi, Kawaguchi (JP)

(73) Assignee: ENPLAS CORPORATION, Saitama (JP)

( * ) Notice: Subject to any disclaimer, the term of this patent is extended or adjusted under 35 U.S.C. 154(b) by 35 days.

(21) Appl. No.: 16/958,039

(22) PCT Filed: Dec. 13, 2018

(86) PCT No.: PCT/JP2018/045852

§ 371 (c)(1),
(2) Date: Jun. 25, 2020

(87) PCT Pub. No.: WO2019/131172

PCT Pub. Date: Jul. 4, 2019

(65) Prior Publication Data

US 2021/0066870 A1 Mar. 4, 2021

(30) Foreign Application Priority Data

Dec. 27, 2017 (JP) ............................ JP2017-252365

(51) Int. Cl.
*H01R 33/97* (2006.01)
*F16C 11/04* (2006.01)
(Continued)

(52) U.S. Cl.
CPC .............. *H01R 33/97* (2013.01); *F16C 11/04* (2013.01); *H01L 23/32* (2013.01); *H01R 33/74* (2013.01)

(58) Field of Classification Search
CPC ........ H01R 33/97; H01R 33/74; H01R 12/82; H01R 12/88; H01R 13/193; H01R 13/20;
(Continued)

(56) References Cited

U.S. PATENT DOCUMENTS 5,009,608 A 4/1991 Shipe
5,013,256 A 5/1991 Matsuoka et al.
(Continued)

FOREIGN PATENT DOCUMENTS

JP 62-137988 8/1987
JP 2-102559 8/1990
(Continued)

OTHER PUBLICATIONS

JP H02-102559 machine translation.*
(Continued)

*Primary Examiner* — Oscar C Jimenez
*Assistant Examiner* — Paul D Baillargeon
(74) *Attorney, Agent, or Firm* — Staas & Halsey LLP

(57) ABSTRACT

An opening/closing mechanism that allows a cover member to be biased according with the degree of opening. A solution is that an opening/closing mechanism of an opening/closing body, comprises: a cover member 15 opening and closing around a shaft center of a third shaft 33 and disposed on a base portion 23, and an opening/closing body 10 in which the cover member 15 is biased toward an opening direction by a biasing force of a spring member 21 wherein a spring support portion 35 is provided on the base portion 23, and a spring receiver 37 is provided on the cover member 15, and in accordance with more opening of the cover member 15, a distance from the spring base portion **41*b* of the spring member 21 to an abutting position in the spring extending portion 41*a* with the spring receiver 37** becomes longer and the biasing force decreases.

9 Claims, 17 Drawing Sheets

(51) Int. Cl.
*H01L 23/32* (2006.01)
*H01R 33/74* (2006.01)

(58) Field of Classification Search
CPC ....... H01L 23/32; F16C 11/04; H05K 7/1053; H05K 7/1023; H05K 7/1061; H05K 7/1007; G01R 1/0466; G01R 1/0483; G01R 31/2863
See application file for complete search history.

(56) References Cited

U.S. PATENT DOCUMENTS

| | | | | |
|---|---|---|---|---|
| 6,383,002 | B1 | 5/2002 | Ohashi | |
| 6,503,089 | B2 * | 1/2003 | Saijo | G01R 1/045 439/70 |
| 7,997,919 | B2 * | 8/2011 | Morinari | H05K 7/1007 439/331 |

FOREIGN PATENT DOCUMENTS

| | | |
|---|---|---|
| JP | 2006-59653 | 3/2006 |
| JP | 4025323 | 12/2007 |

OTHER PUBLICATIONS

Extended European Search Report for European Application No. EP 18894524 dated Aug. 31, 2021.
International Search Report, PCT/ISA/210, dated Mar. 12, 2019 in corresponding International Patent Application PCT/JP2018/045852.
Written Opinion of the International Searching Authority, PCT/ISA/237, dated Mar. 12, 2019 in corresponding International Patent Application PCT/JP2018/045852.

* cited by examiner 10
15e
15d
15
15e
15c 17
21
27
35
13
25
15b
21
19
11
23i
19a
23
23e
23c
23d 17
17a
17d
15
15a
15a
15b
15c
15d
15e
23
23a
23a
23a
23c
23d
23e
23g
23h
23i
25
29
29
29a
30
31
32
33

23
23g
23h
23a
23a
23g
23i
23e
23d
23c 15
15a
15b
15a
15e
15a
15c (a)
(b)
25
30
33
31
15a
15b
32
15
17d
17
17a
23
29
23a
23h
23g
23i
H0
H2

(a)
(b)
(c)
H0
H1
H2
15
17
17a
17d
23
25
29
30
31
32
33

25
23h
33
29
31
32
30
35
41c
41b
41d
21
27
37
41a
17
15
23
23i 29
33
31
32
30
25
17a
21
35
41d 41c
41b
27
37
41a
17
23i
23
23c
23e
15
23d
15c
15d,15e 17c
17
33
29
17a
31
25
32
30
27
41c
41b
35
41d
21
37
23i
41a
23
15
15d
23c
23e
15c
15e
23d

OPENING/CLOSING MECHANISM OF OPENING/CLOSING BODY

CROSS-REFERENCE TO RELATED APPLICATIONS

This application is a U.S. National Stage Application which claims the benefit under 35 U.S.C. § 371 of International Patent Application No. PCT/JP2018/045852 filed on Dec. 13, 2018, which claims foreign priority benefit under 35 U.S.C. § 119 of Japanese Patent Application No. 2017-252365 filed on Dec. 27, 2017, in the Japanese Intellectual Property Office, the contents of all of which are incorporated herein by reference.

TECHNICAL FIELD

The present invention relates to an opening/closing mechanism of an opening/closing body in which a cover member is rotatably disposed with respect to a base portion and is biased toward an opening direction.

BACKGROUND ART

Conventionally, there are various types of opening/closing bodies in which a cover member is provided to be opened and closed with respect to a base portion and in which the cover member is biased toward an opening direction, and a lever member is operated at the state that the cover member is closed, so that the cover member is opened by the biasing force.

IC sockets with contact pins are known as sockets for electrical component for electrically connecting electrical component, such as semiconductor devices (hereinafter referred to as IC package).

In the IC socket, a socket body with a plurality of contact pins is disposed on the wiring substrate, and when the IC package to be inspected is mounted, the terminals of the IC package and the electrodes of the wiring substrate are electrically connected through the contact pins to enable testing of electrical continuity, etc.

As such an IC socket, a clamshell type is known in which the IC package is enclosed in the socket body, the cover member is closed, and the cover member is pushed down by the lever member so that many terminals of the IC package are contacted with each contact pin (see, e.g., Patent Document 1).

PRIOR ART DOCUMENT

Patent Document

Patent Document 1; Japanese Patent No. 4025323

SUMMARY OF INVENTION

Problems to be Solved by the Invention

However, in the opening/closing mechanism used in a socket for electric component of a clamshell type such as in the prior art Patent Document 1, the proximal end of the cover member is pivotally connected to the socket body, the proximal end of the lever member is pivotally connected to the distal end of the cover member, and the proximal end of the lever member is locked to the socket body.

In the socket body, a screw coil spring is mounted at rotational shaft side between the socket body and the cover member. Thus, when the locking of the socket body is released, the cover member is configured to be rotated and is opened by the biasing force of the screw coil spring.

The screw coil spring is formed to have a biasing force which can lift and open from the closed state the cover member above which the lever member has been disposed. Thus, although the cover member can be opened by releasing the locking, it has become clear that the biasing force to the cover member becomes sometimes excessive in accordance with the opening of the cover member.

In other words, the gravity center of the cover member above which the lever member has been disposed approaches to the rotational shaft in accordance with the opening of the cover member. Then, the force necessary for making the cover member to rotate becomes less. Therefore, the biasing force of the screw coil spring becomes relatively larger due to the shifting of the gravity center toward the shaft side. As a result, an impact becomes large since the cover member rotated with an excessive biasing force stops in the case that the cover member is fully opened.

Accordingly, the object of the present invention is to provide an opening/closing mechanism of an opening/closing body that allows the cover member to be biased according with the degree of opening.

Means for Solving Problems

To achieve this problem, the invention of according to claim 1 is characterized in that an opening/closing mechanism of an opening/closing body, comprising:

a cover member opening and closing around a shaft center of a rotating shaft and disposed on a base portion, and an opening/closing body in which the cover member is biased toward an opening direction by a biasing force of a spring member wherein a spring support portion that supports a spring base portion in apart from the rotating shaft is provided on one of the base portion and the cover member, and a spring receiver that abuts a spring extending portion extending from the spring base portion is provided on other of the base portion and the cover member, and in accordance with more opening of the cover member, a distance from the spring base portion of the spring member to an abutting position in the spring extending portion abutting with the spring receiver is configured to become longer and the biasing force is configured to decrease.

The opening/closing mechanism according to claim 2 is, in addition to the invention according to claim 1, characterized in that the spring member is a screw coil spring which includes the spring base portion having a coil portion formed by winding a wire member and a fixing portion formed of one end portion of the wire member, and the spring extending portion formed of other end portion of the wire member.

The opening/closing mechanism according to claim 3, in addition to the invention according to claim 1, is characterized in that the spring member is disposed on a side surface of the base member and the cover member.

The opening/closing mechanism according to claim 4, in addition to the invention according to claim 1, is characterized in that the opening/closing body is a socket for electrical component which comprises a socket body in which the base portion is included and a contact pin is disposed and an electrical component is configured to be housed in a housing portion, and the cover member for pressing the electrical component housed in the housing portion and making the electrical component contact to the contact pin.

Advantageous Effect of Invention

According to the invention of claim 1, in accordance with more opening of the cover member, a distance from the spring base portion of the spring member to an abutting position in the spring extending portion abutting with the spring receiver is configured to become longer and the biasing force is configured to decrease. Therefore, the cover member can be biased by the spring member in accordance with the degree of opening of the cover member.

Thus, at the beginning of opening of the cover member, the distance from the spring base portion to the abutting position in the spring extending portion abutting with the spring receiver is short and the biasing force can be strengthened. Therefore, even if the center of gravity of the cover member is far from the rotating shaft, the cover member can be rotated in the direction in which the cover member is easily opened.

On the other hand, when the cover member raised up by a large opening, the distance from the spring base portion to the abutting position in the spring extending portion abutting with the spring receiver becomes long and the biasing force decreases, and since the center of gravity of the cover member approaches the rotating shaft, the cover member can be rotated in a direction in which the cover member is easily opened even if the biasing force is weak. When the cover member is stopped in the fully opened state, the biasing force is reduced and the impact at the stop position can be greatly reduced.

According to the invention of claim 2, since the spring member is a screw coil spring, by disposing the coil portion and the fixing portion on the rotating shaft side, the other end portion of the wire member can be easily extended long to the direction that is spaced from the rotating shaft and the biasing force at the time of opening and closing of the cover member is easily changed significantly.

According to the invention of claim 3, the spring member is disposed on the side surface of the base member and the cover member. Therefore, even if the spring extending portion of the spring member is provided in a long length, the spring extending portion can be disposed along the base member and the cover member without providing an additional placement space. Thus, the spring member can be easily disposed along the base member and the cover member.

According to the invention of claim 4, the opening/closing body mentioned above is a socket for electrical component. Therefore, when the electrical component is mounted or dismounted, the cover member can be biased by the spring member in accordance with the degree of opening. At the beginning of opening of the cover member, the cover member can be easily opened by the strong biasing force. When the cover member is becoming rising up, the biasing force is decreased, and the impact at the time of stopping in the fully opened state can be depressed. As a result, the opening and closing of the cover member of the socket for electrical component can be smoothly done and the electrical component can be easily mounted and dismounted.

EMBODIMENT OF INVENTION

Hereinafter, embodiments of the present invention will be described in detail with reference to figures.

FIGS. 1-17 illustrate an embodiment of the present invention.

The IC socket 10, as a "socket for electrical component" in this embodiment, is disposed on a wiring substrate (not shown) and is used, for example, in a test device for electrical continuity testing, such as a burn-in test for an IC package.

Figure 1:
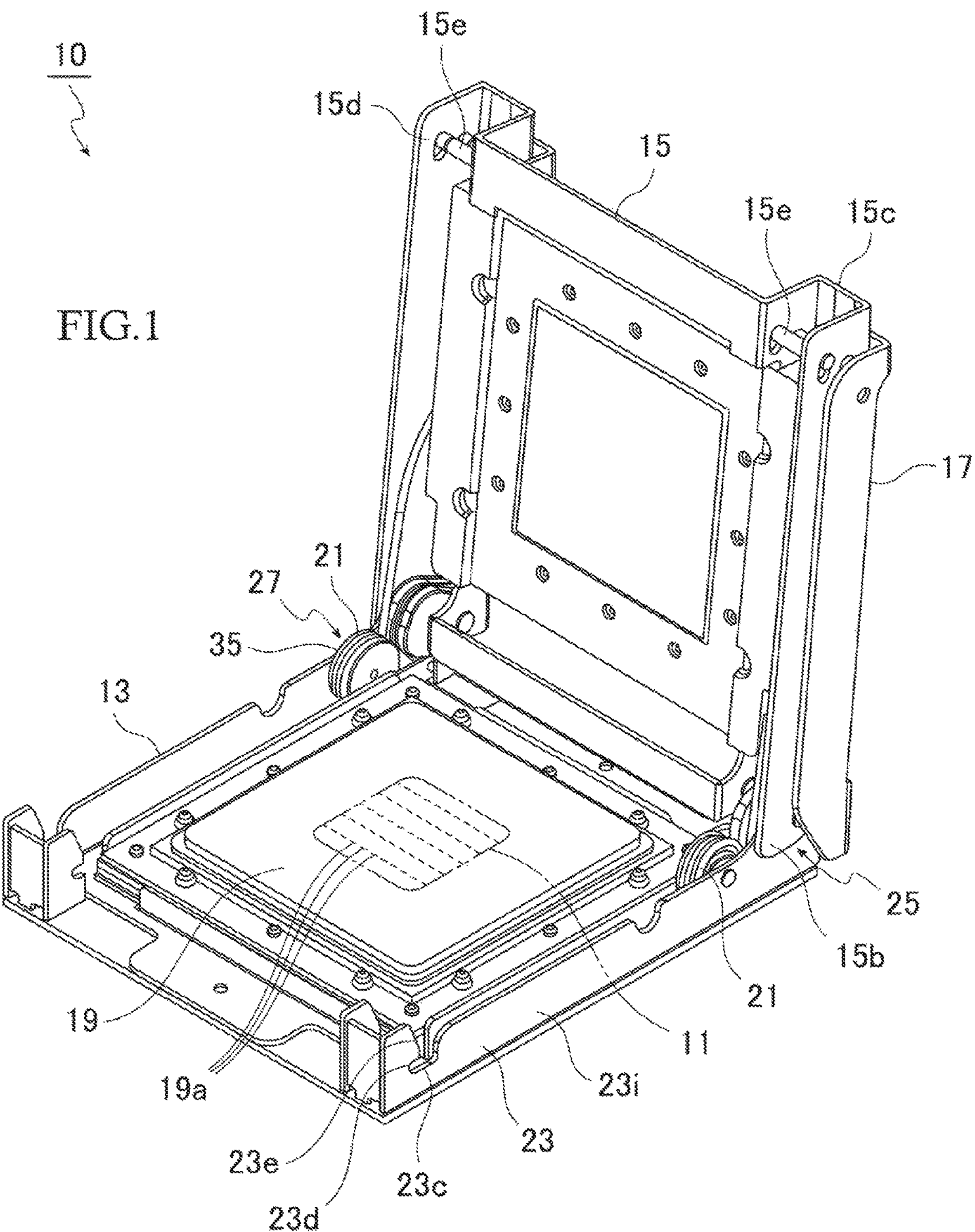
FIG. 1 illustrates the upper side of the IC socket according to an embodiment of the present invention and is a perspective view of the front side when the opening/closing mechanism is opened.
Figure 2:
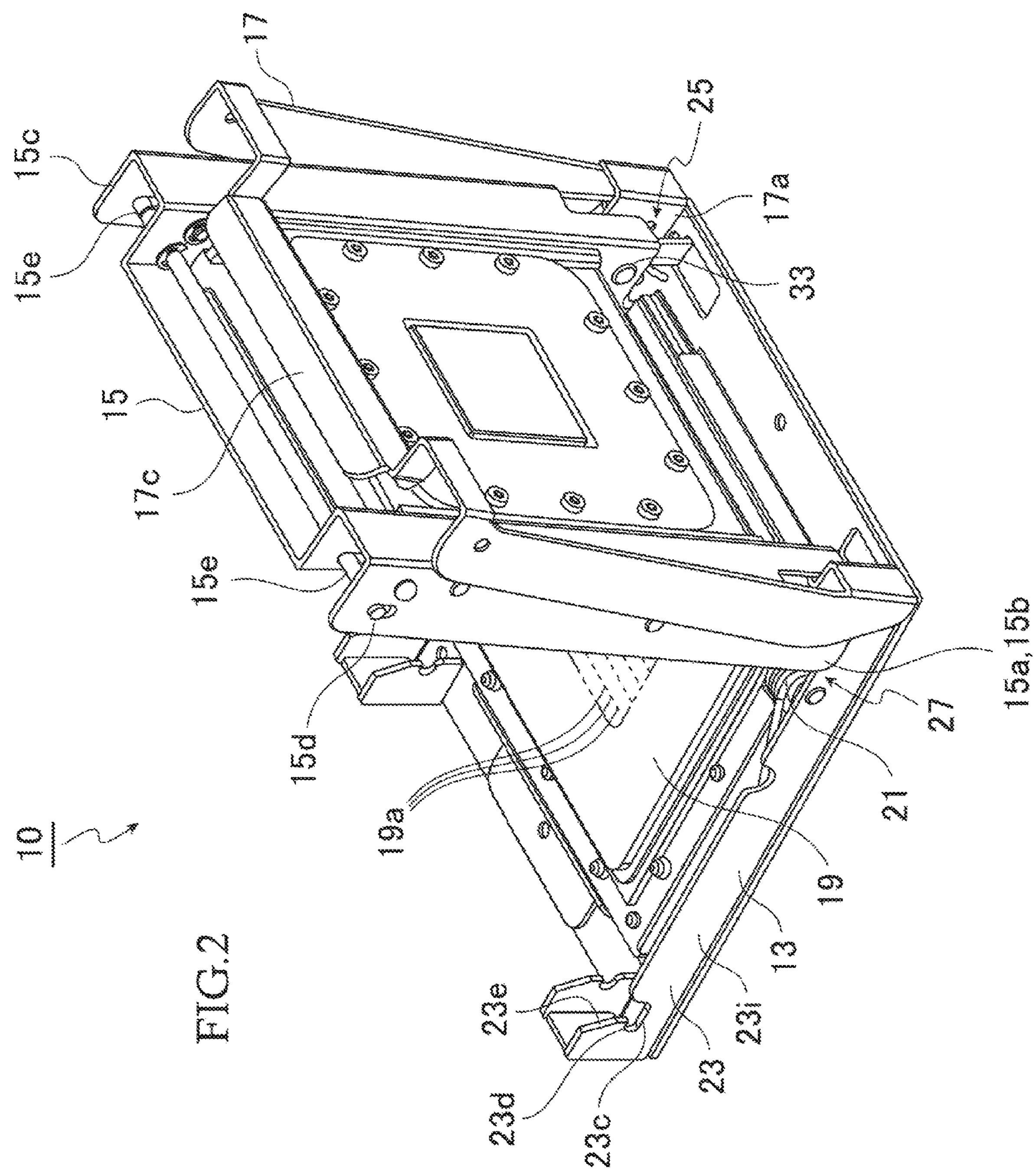
FIG. 2 illustrates the upper side of the IC socket according the embodiment of the present invention and is a perspective view of the back side when the opening/closing mechanism is opened.

As shown in FIGS. 1 and 2, the IC socket 10 includes a socket body 13 for accommodating the IC package 11 as an "electrical component" on the top surface, a cover member 15 for pressing the IC package 11 accommodated in the socket body 13, a lever member 17 for pressing the cover member 15, and a spring member 21 for biasing the cover member 15 in the direction in which the cover member 15 opens.

The IC socket 10 of this embodiment comprises an opening/closing body in which the cover member 15 and the lever member 17 mounted on the socket body 13 are rotated to be openable/closable. As shown in FIGS. 1-4, the IC socket 10 includes an opening/closing mechanism in which the cover member 15 and the lever member 17 are rotatably coupled to one edge of the base portion 23 of the socket body 13.

In the following description, the proximal end side indicates the side edge side at which the cover member 15 and the lever member 17 are rotatably connected to the socket body 13, and the distal end side indicates the opposite side edge side.

Figure 5:
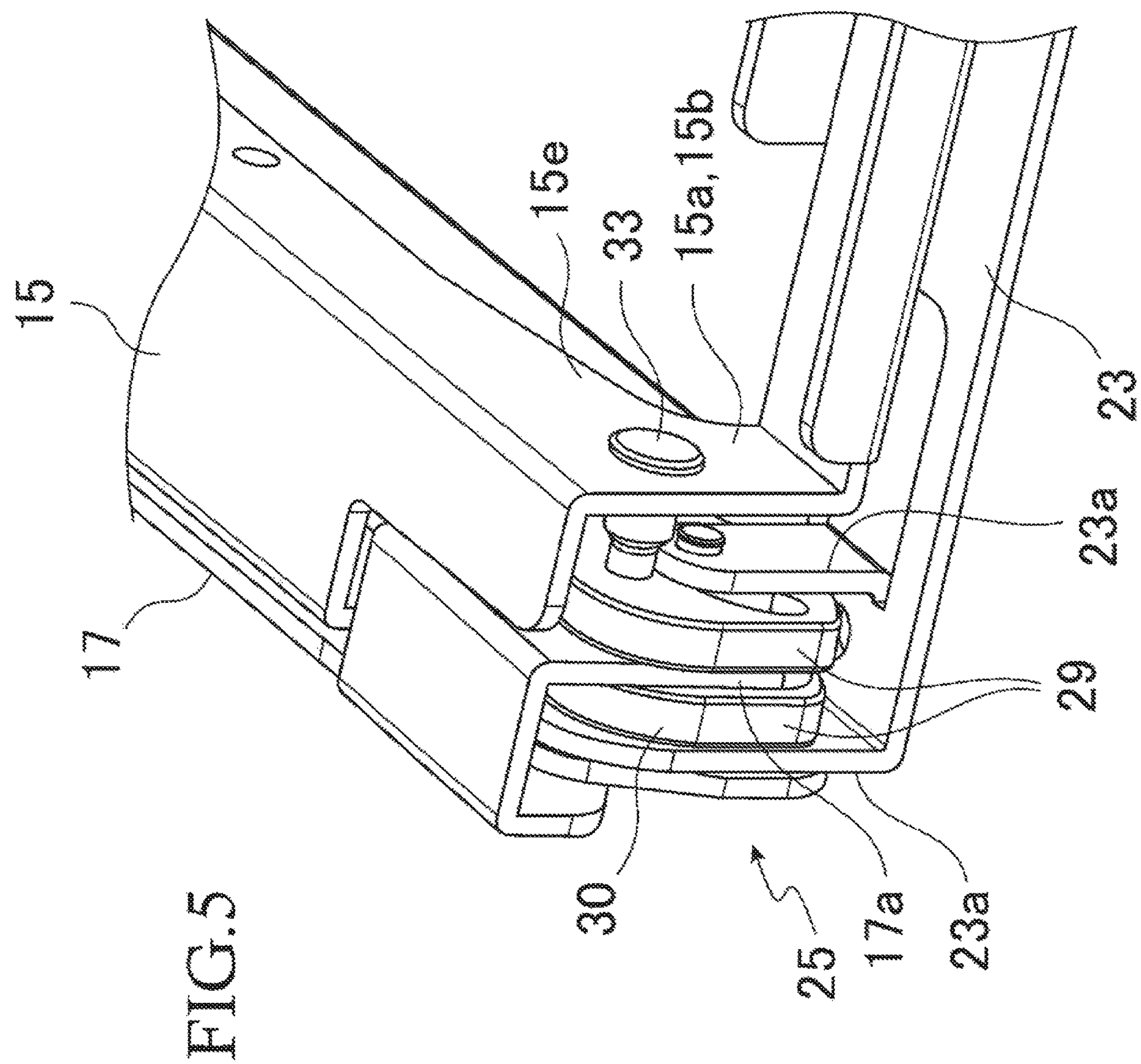
FIG. 5 is a partial perspective view illustrating an opening/closing mechanism of an IC socket according to the embodiment of the present invention.
Figure 6:
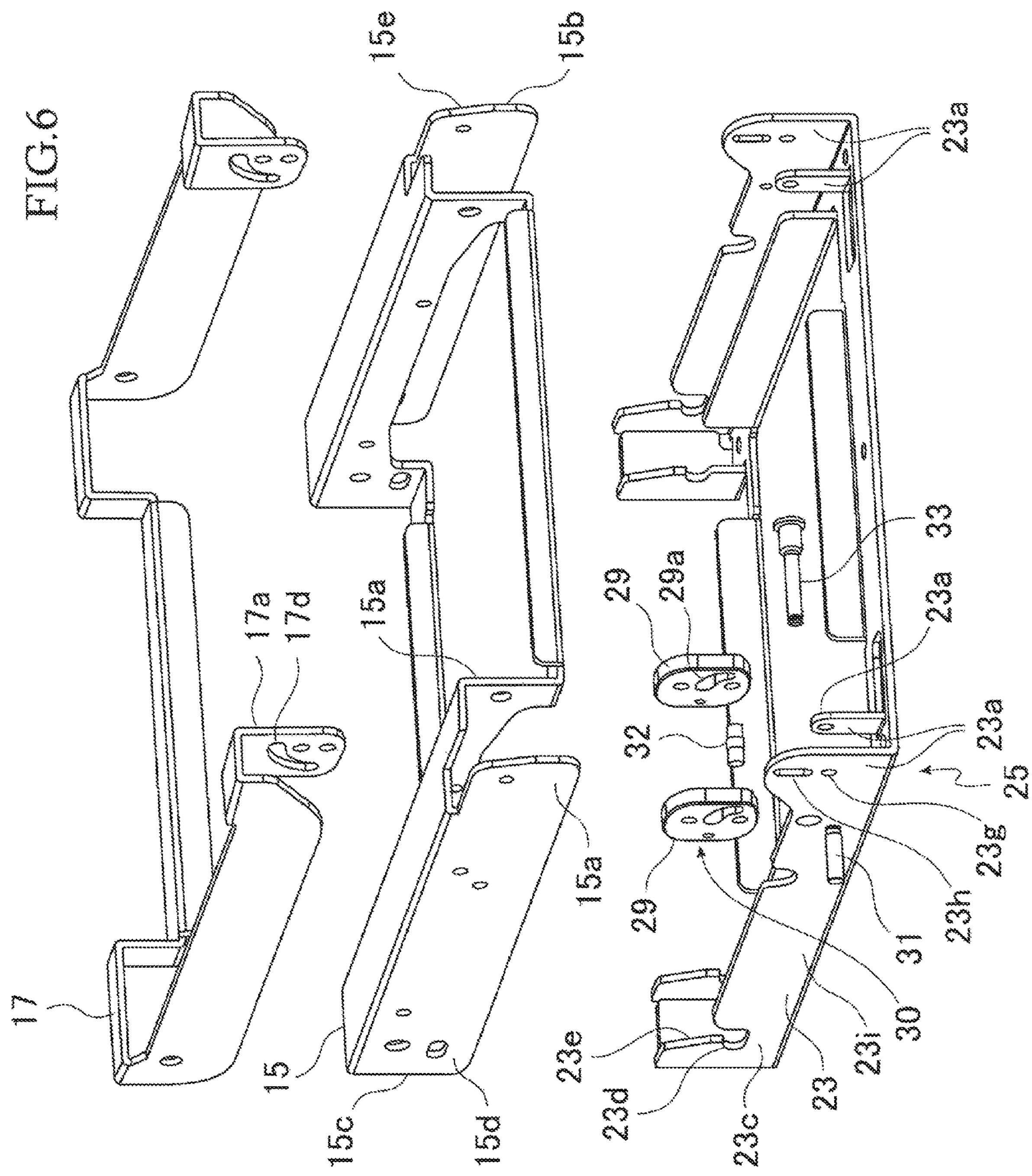
FIG. 6 is an exploded perspective view illustrating an IC socket according to the embodiment of the present invention.
Figure 14:
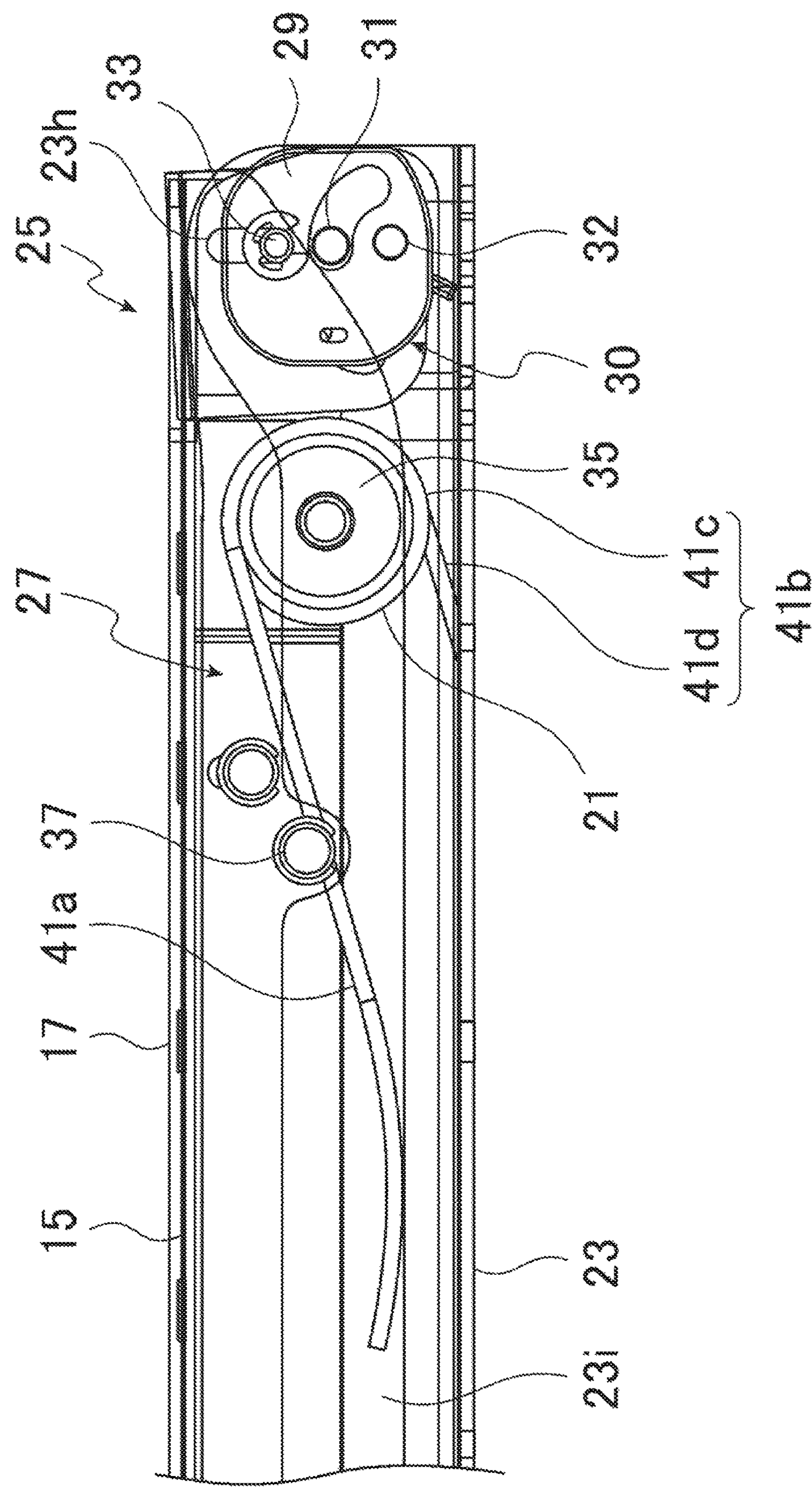
FIG. 14 is a partial projection view explaining the biasing means of an IC socket according to the embodiment of the present invention.

The opening/closing mechanism includes a pressing means 25 as shown in FIGS. 5 and 6 that presses the cover member 15 down by closing the lever member 17 while the cover member 15 is closed, and the opening/closing mechanism includes a biasing means 27 as shown in FIG. 14 for biasing the cover member 15 in the direction that the cover member 15 opens.

First, the socket body 13 includes a metal base portion 23 and a contact pin unit 19 which is disposed inside the base portion 23 and has a plurality of contact pins 19*a*, as shown in FIG. 1.

A housing portion for the IC package 11 is provided at the upper side of the contact pin unit 19. By pressing down the IC package 11 located at the housing portion from above, the terminals on the lower surface of the IC package 11 are able to contact the plurality of contact pins 19*a*.

Figure 7:
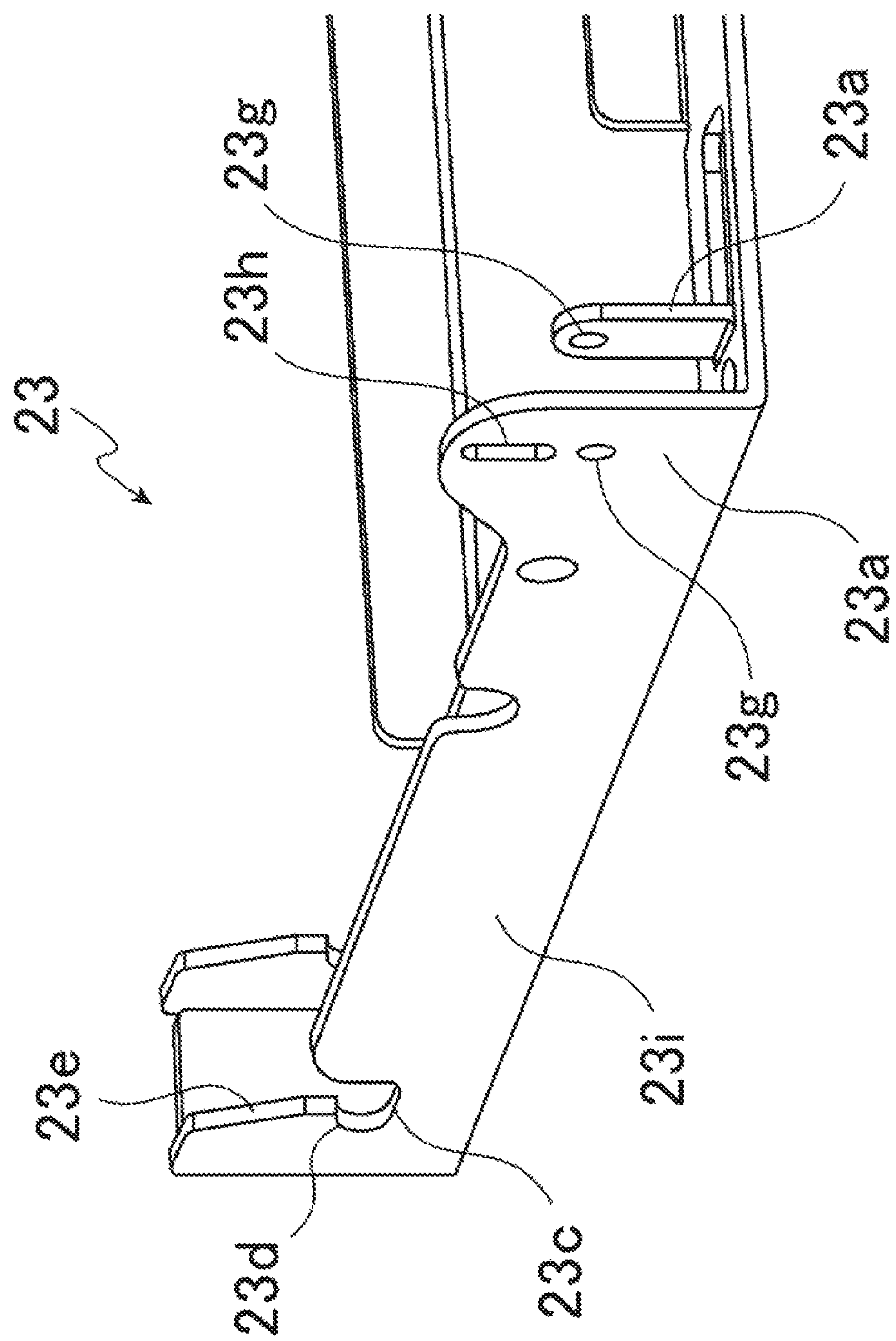
FIG. 7 is a partial perspective view illustrating the base portion of the socket body according to the embodiment of the present invention.

The base portion 23 illustrated in FIG. 7 is frame-shaped to enclose and support the contact pin unit 19. At both ends of the proximal end side, a plurality of base connection pieces 23*a* for coupling the cover member 15 and the lever member 17 to the base portion 23 via the pressing means 25 are provided. Each base connection piece 23*a* is formed in a flat plate along the rotational direction of the cover member 15 and the lever member 17 and is arranged parallel to each other.

The distal end side of the base portion 23 is provided with a distal end support portion 23*c* for supporting a cover distal end 15*c* when the cover member 15 is closed. The distal end support portion 23*c* is formed in the shape of a bent opening groove. The distal end support portion 23*c* includes a contact support portion 23*d* of the horizontal direction supporting the distal end side of the cover member 15 in contact with the distal end side of the cover member 15 in a rotational direction and in an upward direction and a tapered guide portion 23*e* guiding to the contact support portion 23*d* while being elastically displaced by pressing against one edge when the distal end side of the cover member 15 is closed.

As shown in FIGS. 1-4, the cover member 15 is formed to be able to press the IC package 11 accommodated in the socket body 13, and the cover proximal end 15*b* is openably and closably connected to the socket body 13 via a pressing means 25.

Figure 8:
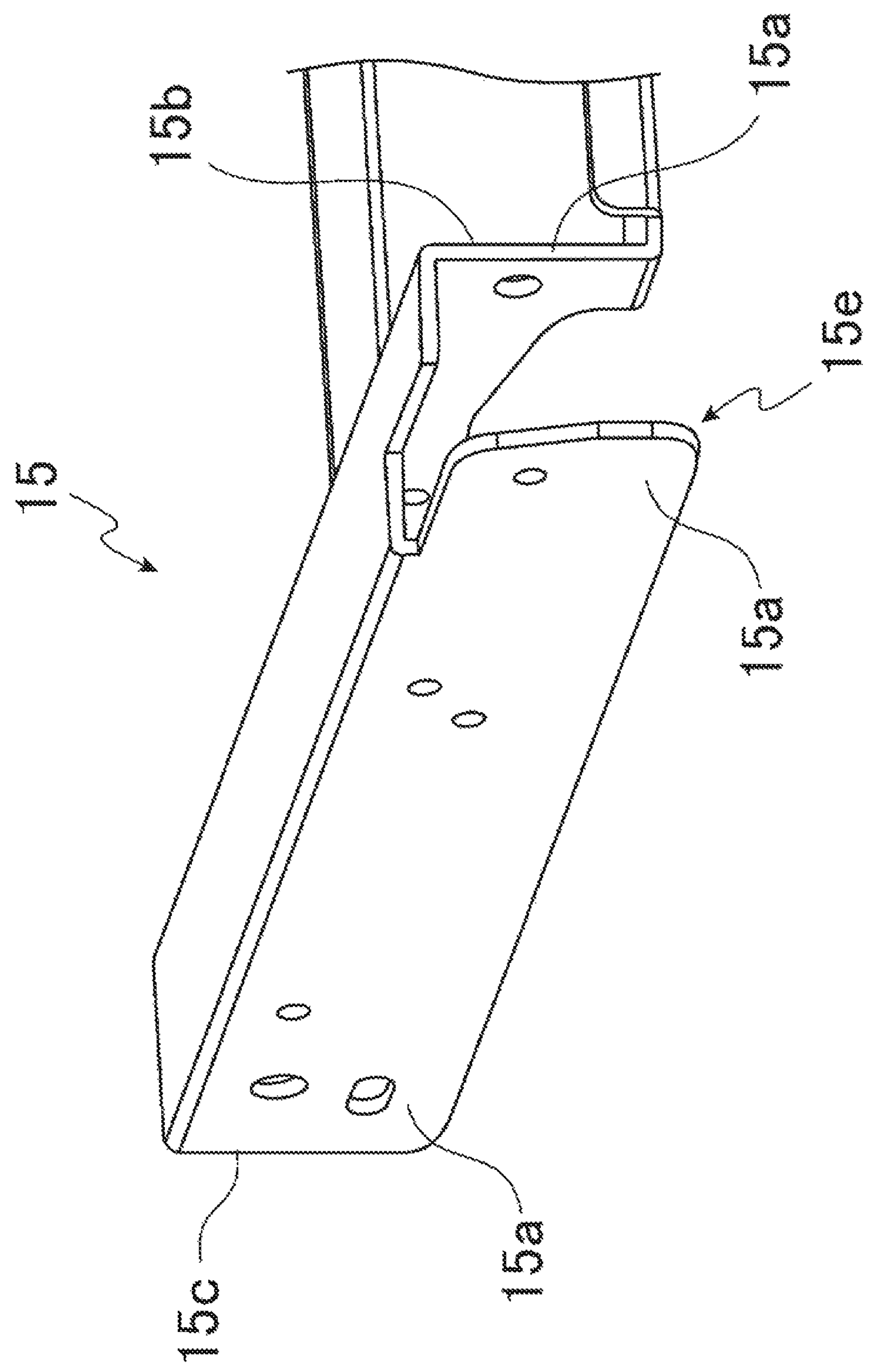
FIG. 8 is a partial perspective view illustrating the cover member of an IC socket according to the embodiment of the present invention.

As shown in FIG. 8, the cover member 15 includes a plurality of cover connection pieces 15*a* at the cover proximal end 15*b*. The plurality of cover connection pieces 15*a* are formed as flat plates along the rotational direction of the cover member 15 and the lever member 17, respectively, and are arranged parallel to each other. These cover connection pieces 15*a* are disposed on both sides of a pair of base connection pieces 23*a* provided on the base portion 23 of the socket body 13.

On the other hand, as shown in FIG. 1, the cover distal portion 15*c* of the cover member 15 is provided with a movable supported portion 15*d* that is removable from the contact support portion 23*d* of the distal support portion 23*c* of the base portion 23. The movable supported portion 15*d* includes a shaft 15*e* that can be inserted into the distal support portion 23*c*. The shaft 15*e* is biased toward the cover distal end 15*c* side from the cover proximal end 15*b* side. For example, by operating an operation piece 17*c* provided at the distal end of the lever member 17, the shaft 15*e* can be displaced against the biasing force.

The lever member 17 is formed to be able to press the cover member 15 while the cover member 15 is closed and the proximal end side is connected to the socket body 13 through the pressing means 25.

Figure 9:
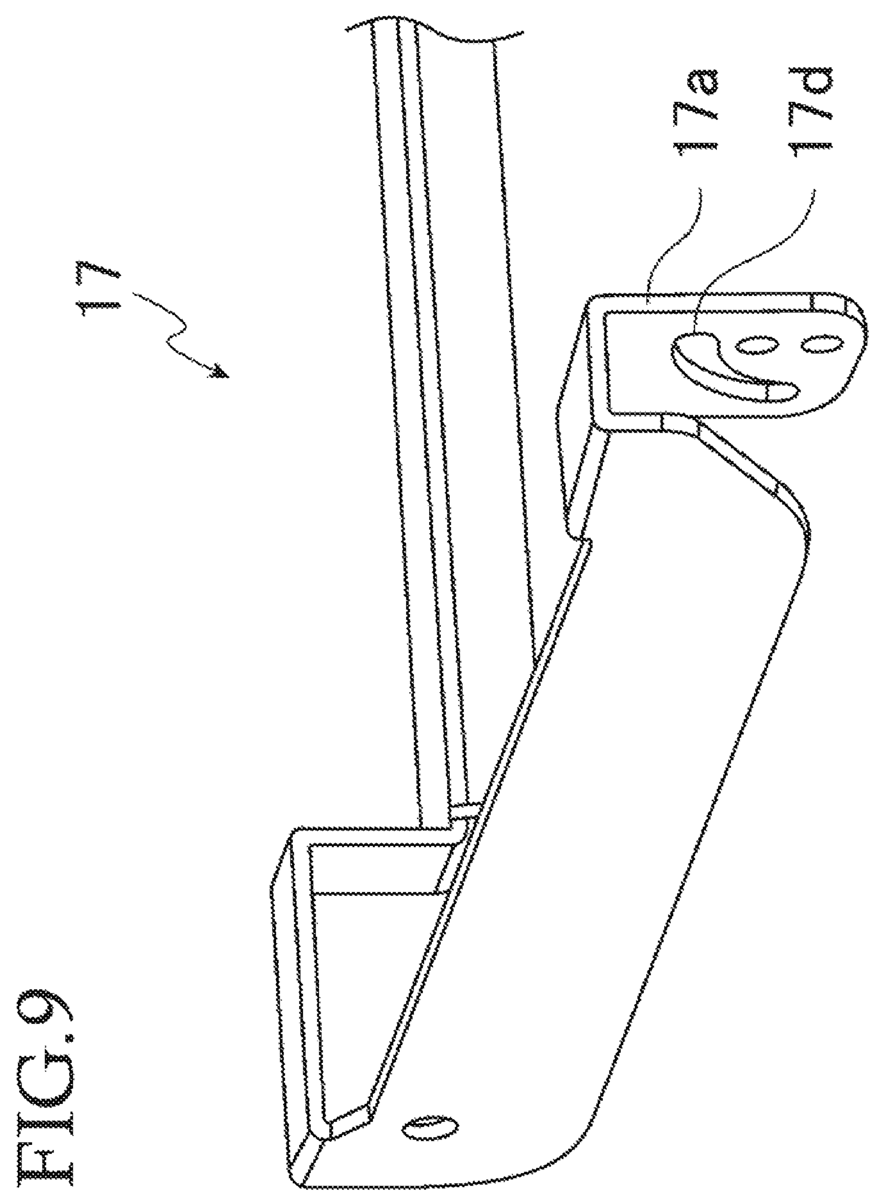
FIG. 9 is a partial perspective view illustrating the lever member of an IC socket according to the embodiment of the present invention.

As shown in FIG. 9, the lever member 17 includes a lever connection piece 17*a* on the proximal end side. The lever connection piece 17*a* is formed in a flat plate shape along the rotational direction of the cover member 15 and the lever member 17.

Figure 10:
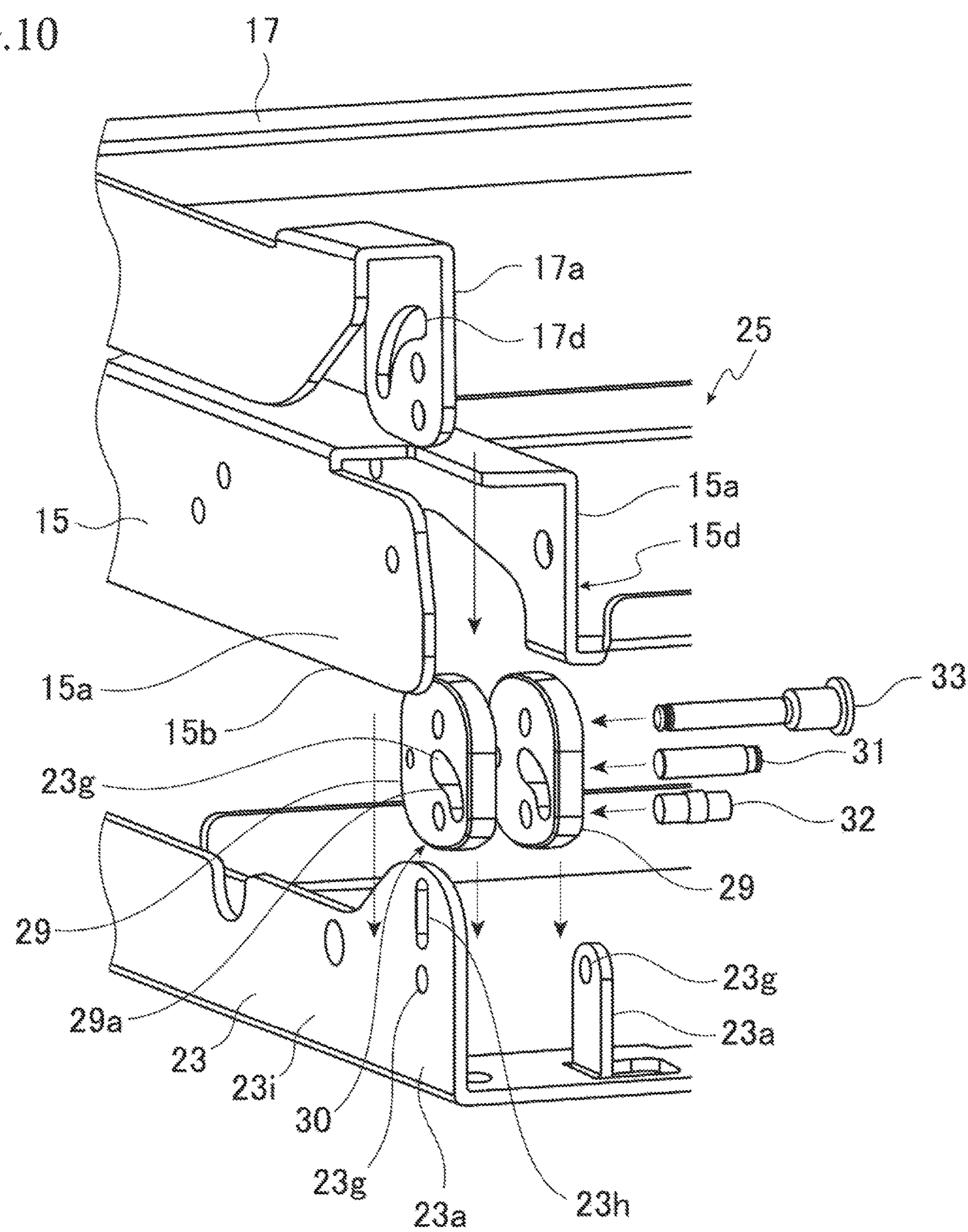
FIG. 10 is an enlarged exploded perspective view illustrating the opening/closing mechanism of an IC socket according to the embodiment of the present invention.

The lever connection piece 17*a* is disposed between a pair of cover connection pieces 15*a* of the cover members 15 and a plurality of base connection pieces 23*a* of the socket body 13, as shown in FIGS. 5 and 10. It is further interposed between the plurality of link plates 29 described below.

Figure 11:
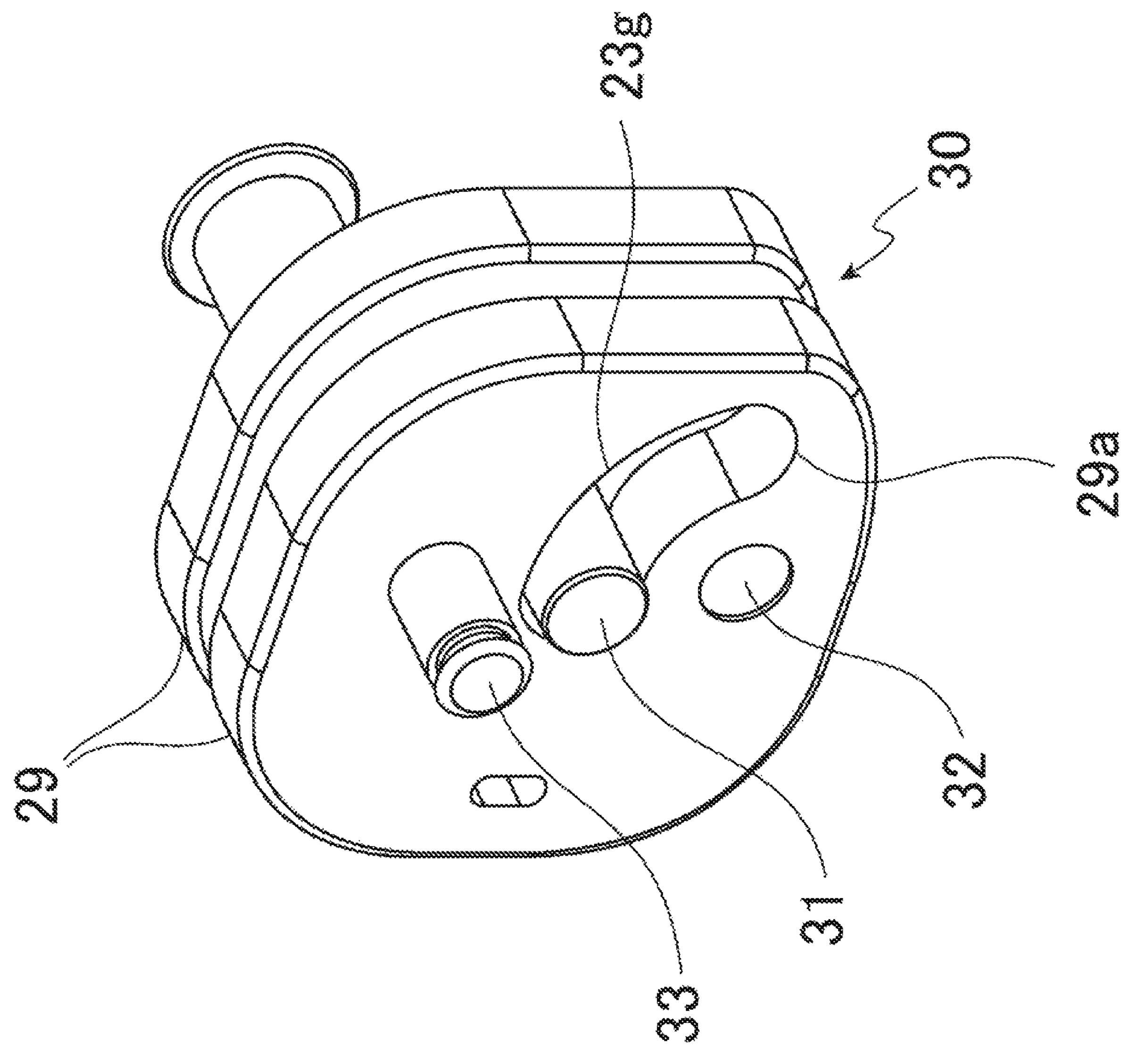
FIG. 11 is a perspective view illustrating a rotating link mechanism of an IC socket according to the embodiment of the present invention.

As shown in FIGS. 5, 10, and 11, the pressing means 25 includes a plurality of base connection pieces 23*a* of the base portion 23, a cover connection piece 15*a* of the cover member 15, and a lever connection piece 17*a* of the lever member 17 arranged parallel to each other in a proximity position, which are connected to each other via a rotating link mechanism 30.

The rotating link mechanism 30 includes a plurality of link plates 29 as the link member and a first shaft 31 to a third shaft 33, as shown in FIG. 11. Here, the plurality of link plates 29 are formed in substantially the same shape and are disposed adjacent to both side of the lever connection piece 17*a* sandwiched between the base connection pieces 23*a*. The first shaft 31 to the third shaft 33 are arranged in parallel with each other orthogonal to the rotational direction of the cover member 15 and the lever member 17 to connect the link plates 29 and each of the connection pieces 15*a*, 17*a*, 23*a*.

In the pressing means 25, a first support hole 23*g* is provided at a position opposite each other below the plurality of base connection pieces 23*a* and 23*a*, the first shaft 31 is supported between the first support holes 23*g*, and the plurality of link plates 29 are pivotally and movably connected to the first shaft 31.

The plurality of link plates 29 are connected together by the second shaft 32 at a position different from the first shaft 31.

Further, in the pressing means 25, the third shaft 33 is provided through the plurality of link plates 29, and the cover connection piece 15*a* is pivotally connected to the third shaft 33.

One of the base connection pieces 23*a* has a long hole 23*h* formed up and down in line along the contact direction of the contact pin 19*a* in the socket body 13, and the third shaft 33 is vertically movably supported on the straight hole 23*h*.

This allows the cover member 15 to be connected to the base member 23 pivotally and liftablly.

Next, in the pressing means 25, a first support hole 23*g* is provided coaxially at the lower position to the straight hole 23*h* of the one of the base connection pieces 23*a* and at the opposite position to the lower position of the other base connection pieces 23*a*, 23*a*. The shaft center of the first shaft 31 is positioned vertically downward of the shaft center of the third shaft 33.

A lever connection piece 17*a* is rotatably supported on the first shaft 31. Therefore, the lever member 17 is rotatable relative to the base portion 23 about the shaft center of the first shaft 31.

A second shaft 32 is also attached to the position spaced from the first shaft 31 of the lever connection piece 17*a*, and the lever connection piece 17*a* is rotatablly connected relative to the plurality of link plates 29 by the second shaft 32.

And, the plurality of link plates 29 are connected to the cover member 15 by the third shaft 33 at a position different from the first shaft 31 and the second shaft 32.

By rotating the lever member 17 about the shaft center of the first shaft 31 relative to the base portion 23, the cover member 15 is connected to the base portion 23 so as to rotate through the link plates 29.

In the pressing means 25, the lever connection piece 17*a* is provided with a third escape hole 17*d* having a substantially arc-like shape centered substantially on the second shaft 32 at the side opposite to the first shaft 31. A third shaft 33 is disposed in the third escape hole 17*d* through which the third shaft 33 can move relatively.

A first escape hole 29*a* having an arc-like shape centered on the position of the first shaft 31 is provided between the position of the third shaft 33 and the position of the second shaft 32 in the link plate 29. The first shaft 31 is disposed in the first escape hole 29*a* through which the first shaft 31 can move relatively.

Next, a biasing means 27 that biases the cover member 15 in the direction of opening will be described.

Figure 16:
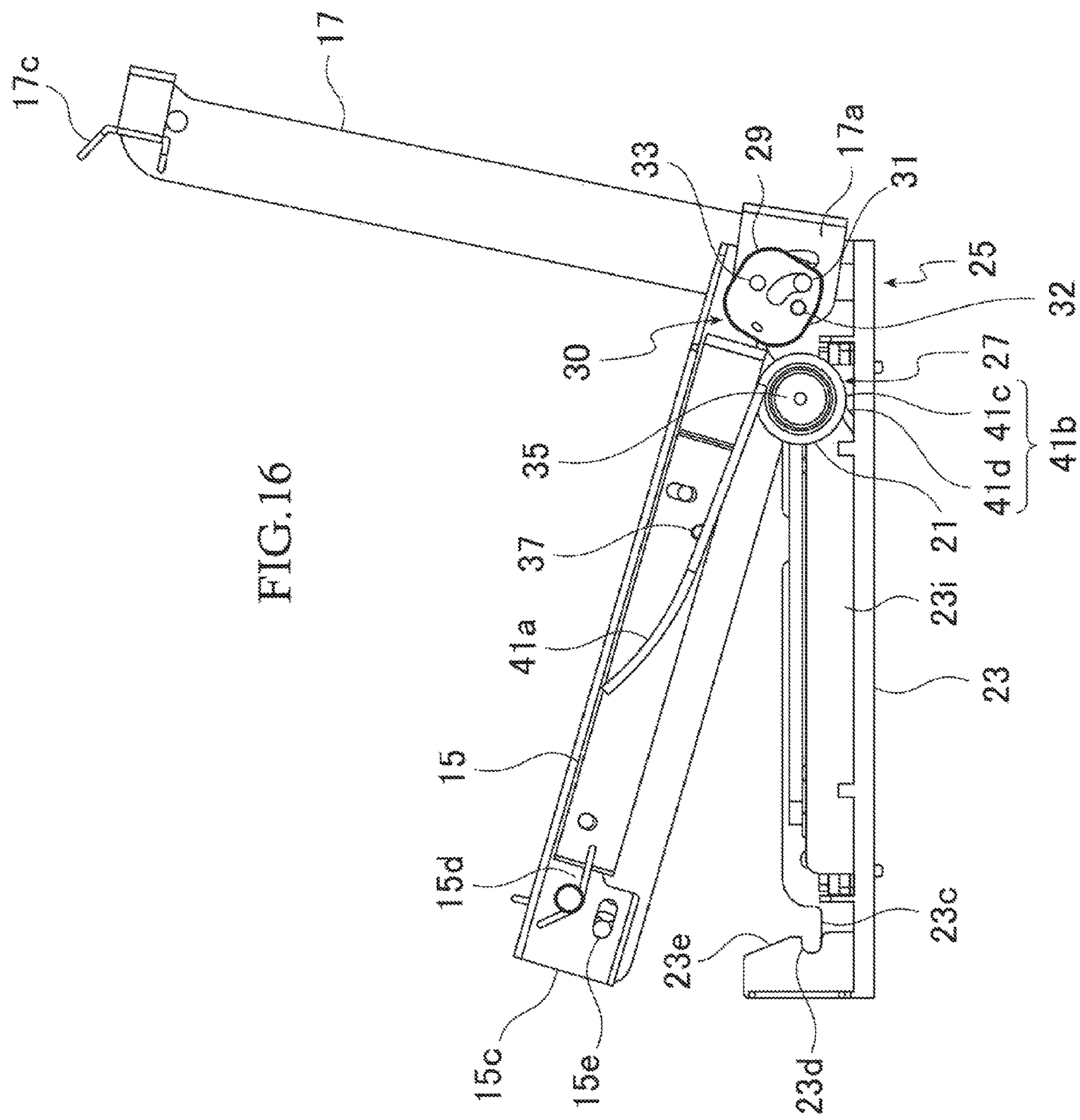
FIG. 16 is a diagram explaining an operation of the biasing means of an IC socket according to the embodiment of the present invention, and shows the state that the cover member is half opened.

As shown in FIG. 16, the biasing means 27 is disposed on the side surface of the base portion 23 and the cover member 15 and between the base portion 23 and the cover member 15.

The biasing means 27 is provided with a spring support portion 35 which is disc-shaped away from the third shaft 33 as the rotating shaft on the front and rear frame piece 23*i* extending from the proximal end side to the distal end side of the base portion 23, and the spring member 21 is supported on the spring support portion 35.

On the other hand, the cover member 15 is provided with a spring receiver 37 spaced apart from the third shaft 33 for abutting the spring member 21 and inputting the biasing force of the spring member 21 to the cover member 15. Here, the spring receiver 37 comprises a projection extending laterally from the cover member 15.

In this embodiment, the spring member 21 includes a spring base portion 41*b* disposed on the side of the base portion 23 and a spring extending portion 41*a* extending from the spring base portion 41*b*. Here, a screw coil spring comprising a coil portion 41*c* that a wire member is wound around, a fixing portion 41*d* that is made of one end of a wire member, and a spring extending portion 41*a* that is made of the other end of a wire member is used. The spring base portion 41*b* is configured by the coil portion 41*c* and the fixing portion 41*d*.

The spring member 21 is supported by winding the coil portion 41*c* around the outer circumference of the spring support portion 35, and the fixing portion 41*d* is fixed to the base portion 23.

On the other hand, the spring extending portion 41*a* is disposed in contact with the spring receiving portion 37 of the cover member 15 in an opening direction of the cover member 15 without being fixed thereto.

In the biasing means 27, since the spring base portion 41*b* is supported to the spring support portion 35 disposed apart from the third shaft 33, the distance from the spring base portion 41*b* of the spring member 21 to the contact position of the spring receiver 37 of the spring extending portion 41*a* increases as the cover member 15 opens, thereby the biasing means 27 is configured to reduce the biasing force.

In order to accommodate the IC package 11 and connect the electrodes on the lower surface to the contact pins 19*a* of the socket body 13 in the IC socket 10 having such an opening/closing mechanism, the IC package 11 is housed in place of the socket body 13 while the cover member 15 and the lever member 17 open, as shown in FIGS. 1 and 2.

Then, since the cover member 15 is pivotally connected to the base portion 23, the cover member 15 is rotated in the closing direction about the shaft line of the third shaft 33 and disposed in the closed state. Accordingly, the movable supported portion 15*d* provided on the distal end side of the cover member 15 is received and supported by the distal end support portion 23*c* provided on the other side edge side of the socket body 13.

Figure 12:
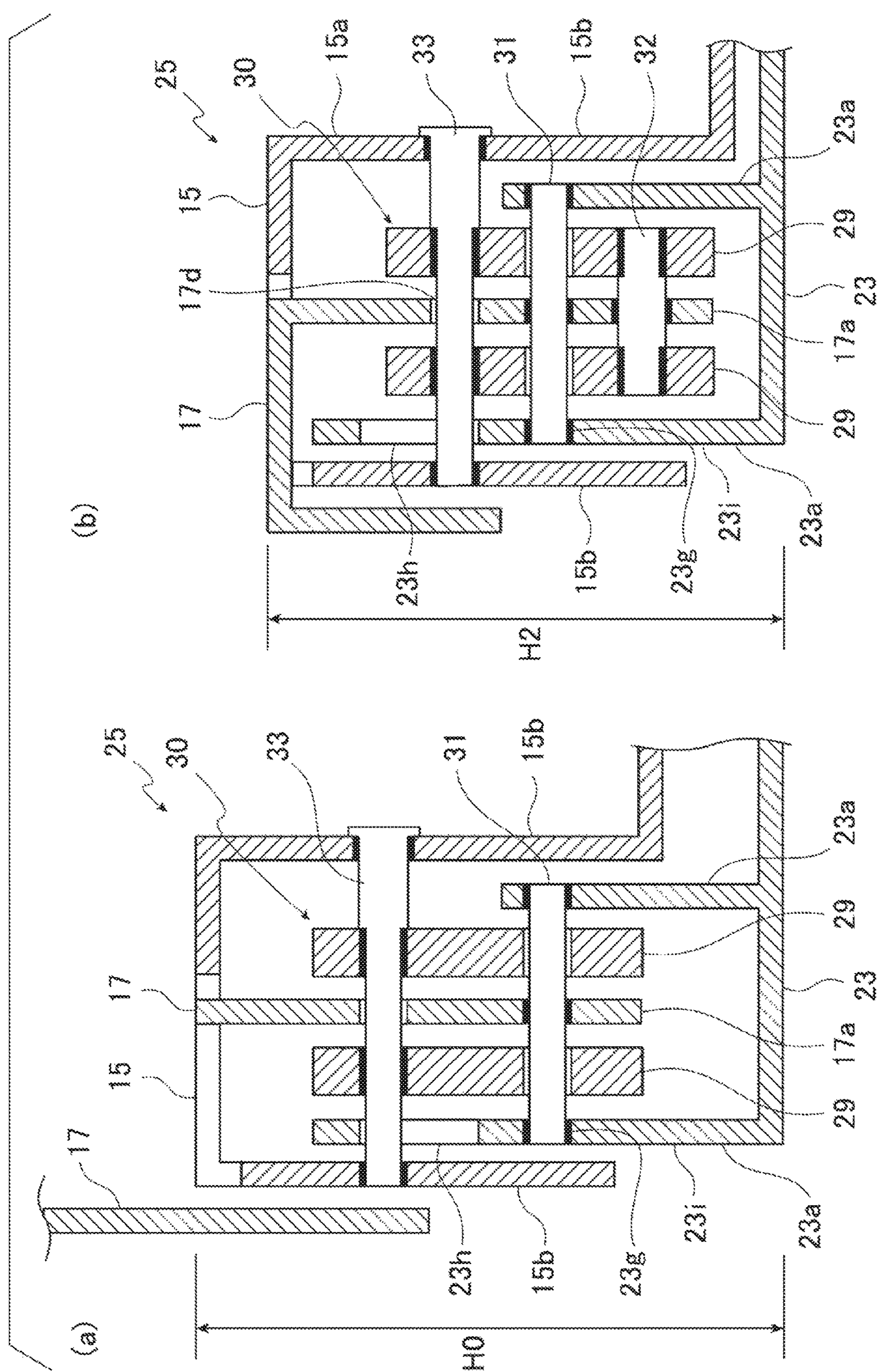
FIG. 12 is a longitudinal cross-sectional view in a width direction illustrating the pressing means of an IC socket according to the embodiment of the present invention, in which (a) indicates that the lever member is opened and (b) indicates that the lever member is closed.

At this time, as shown in FIGS. 12(*a*) and 13(*a*), the second shaft 32 is disposed laterally to the first shaft 31 at the state that the lever member 17 is open, and the cover member 15 is disposed at the position H0 most elevated from the socket body 13.

Figure 3:
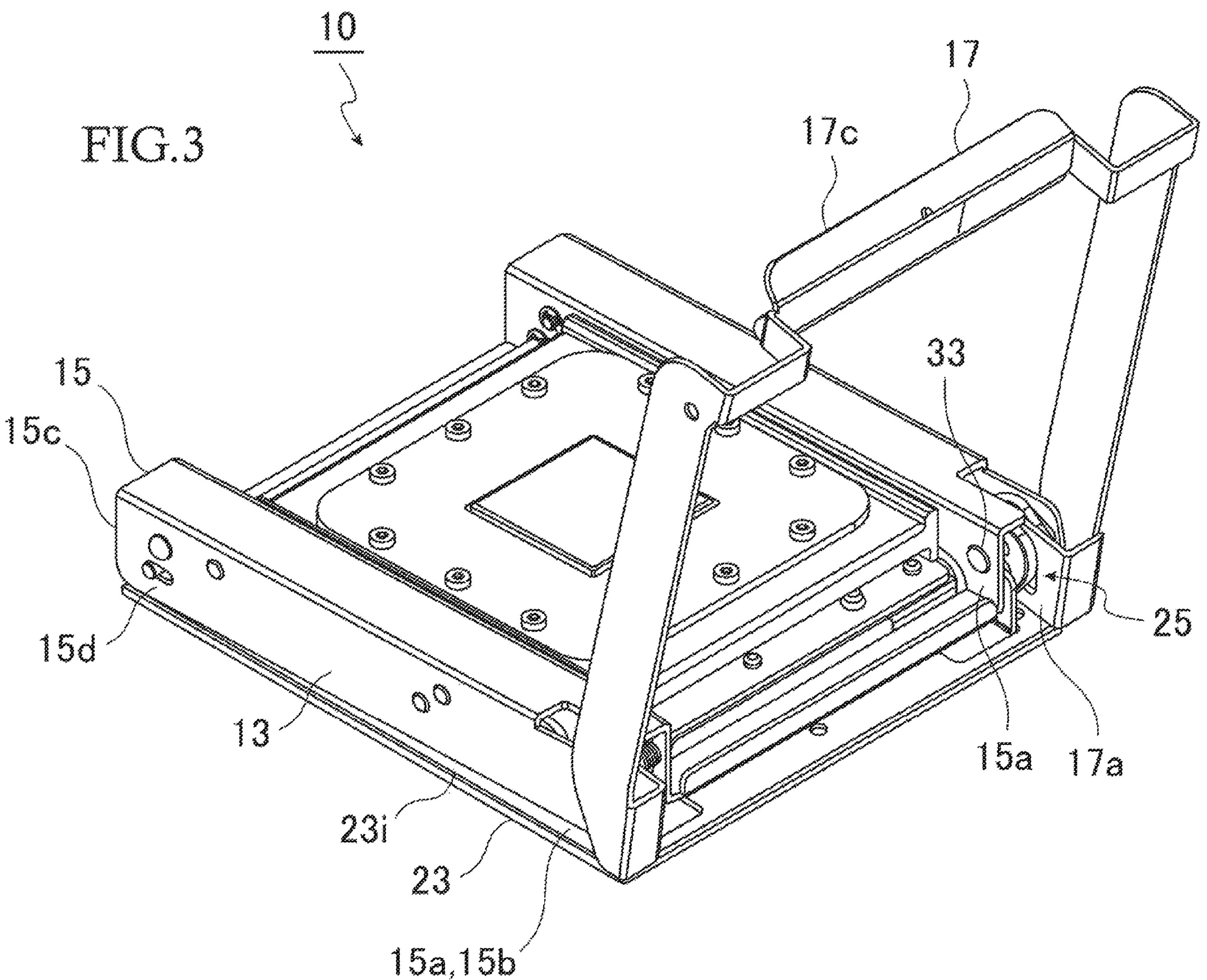
FIG. 3 illustrates the upper side of the IC socket according to the embodiment of the present invention and is a perspective view of the back side when the cover member is closed.
Figure 4:
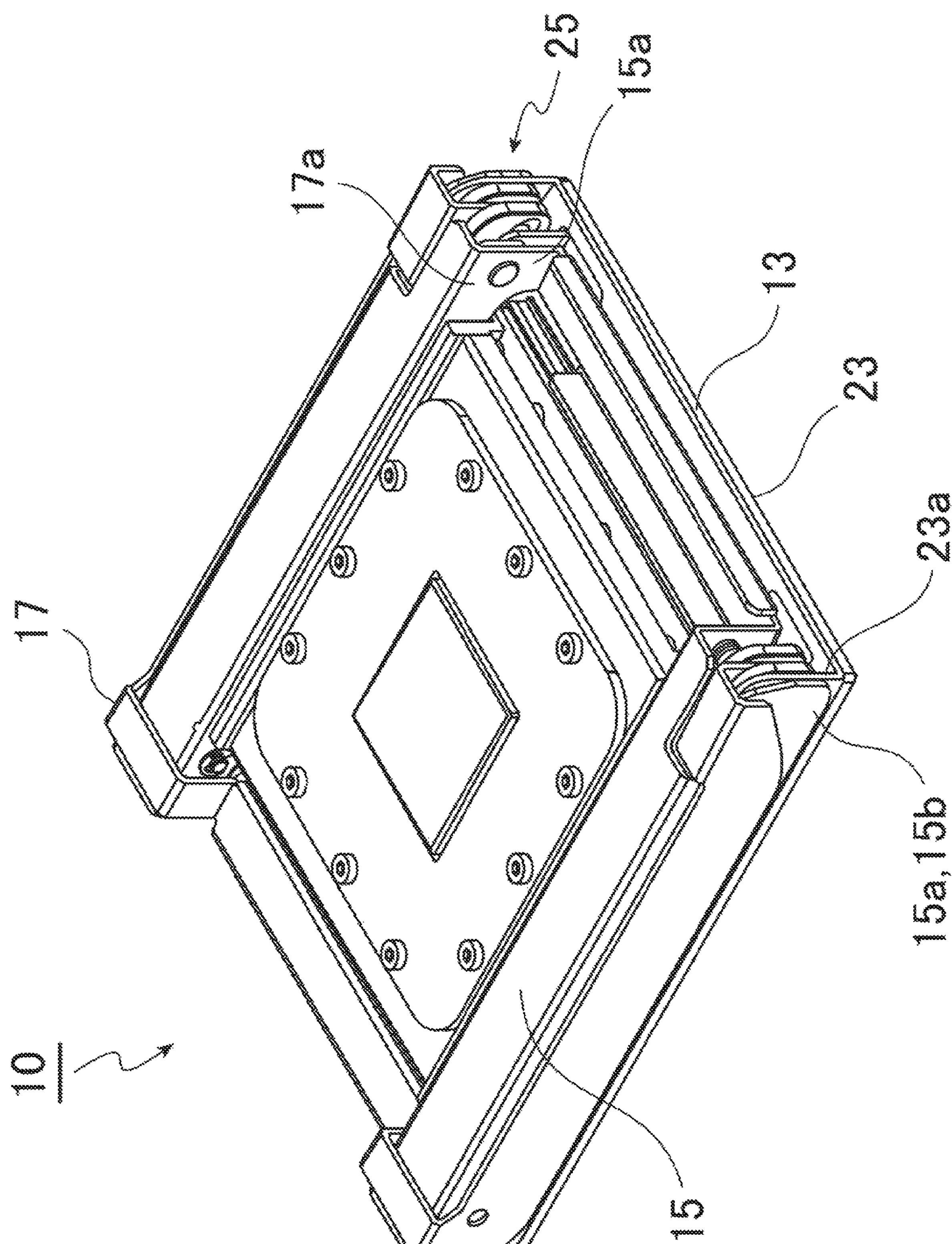
FIG. 4 illustrates the upper side of the IC socket according to the embodiment of the present invention and is a perspective view of the back side when the cover member and lever member are closed.

As shown in FIGS. 3 and 4, when the cover member 15 is closed and the movable supported portion 15*d* of the cover distal end 15*c* reaches the distal end support portion 23*c* of the base portion 23, the shaft 15*e* of the movable supported portion 15*d* is pressed and guided by the guide portion 23*e* of the distal end support portion 23*c* while resiliently displaced to be locked to the contact support portion 23*d*. The cover distal end 15*c* of the cover member 15 is supported on the distal end support portion 23*c* of the base portion 23.

When the shaft 15*e* is locked to the distal end support portion 23*c*, the shaft 15*e* is in contact with the distal end support portion 23*c* in the direction in which the shaft 15*e* opens and is supported to be transversely displaceable and non-rotatable. If the shaft 15*e* is displaced toward the cover proximal end 15*b* against the biasing force, the locking between the shaft 15*e* and the distal end support portion 23*c* can be released.

Figure 13:
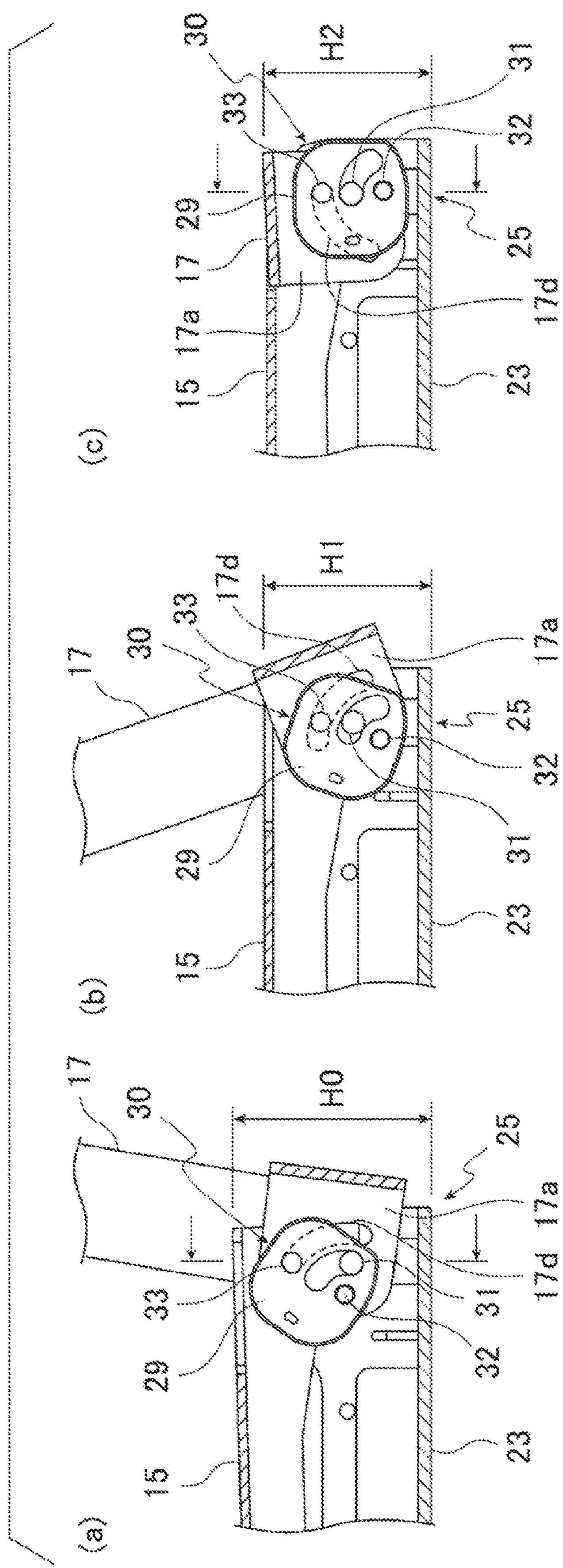
FIG. 13 is a longitudinal cross-sectional view in a front and back direction illustrating the pressing means of the IC socket according to the embodiment of the present invention, in which (a) indicates that the lever member is fully opened, (b) indicates that the lever member is half opened, and (c) indicates that the lever member is fully closed.

When the lever member 17 is going to close at the state that the cover member 15 is closed as shown in FIG. 3, the lever member 17 rotates around the shaft center of the first shaft 31 in the direction in which the lever member 17 closes, as shown in FIG. 13(*b*). The link plate 29 coupled to the lever member 17 also rotates through the second shaft 32 in the direction in which the lever member 17 closes.

In this way, the second shaft 32 moves downwardly so that it rotates with respect to the first shaft 31, and the link plate 29 and the third shaft 33 move downwardly while these are rotating. At this time, the third shaft 33 is disposed within the long hole 23*h* of the base portion 23, so that the third shaft 33 moves downward along the long hole 23*h*.

As a result, the cover member 15 is pushed down to the lower position H1 along the long hole 23*h* through the third shaft 33. When the cover member 15 is pushed down, the IC package 11 is pushed down and the terminals on the lower surface of the IC package 11 are pressed against the biasing force to a number of contact pins 19*a* disposed on the socket body 13.

This loads the cover member 15 with a large reaction force of the number of contact pins 19*a*, and the large force is loaded to the cover member 15 in the direction spaced away from the socket body 13, i.e., upward.

In this state, when the lever member 17 is rotated around the shaft center of the first shaft 31 in the direction of closing, an upward force is loaded to the lever member 17, thereby increasing the operating force.

From this state, as shown in FIG. 13(*c*), by rotating the lever member 17 about the shaft center of the first shaft 31 in the direction of closing, the second shaft 32 is moved to the position where the second shaft 32 goes below the first shaft 31, and the position of the third shaft 33 can be further lowered, and the cover member 15 can be lowered to the lower position H2 which is most proximal to the socket body 13.

This allows the IC package 11 to be pushed down most by the cover member 15, and a number of solder balls on the lower surface of the IC package 11 can be contacted to the number of contact pins 19*a* disposed on the socket body 13 at a desired contact pressure.

In this embodiment, by further rotating the lever member 17, the shaft center of the second shaft 32 moves from one side of the shaft center of the first shaft 31 to the other side beyond right below the shaft center of the first shaft 31, thereby finishing operating the lever member 17 to the closing direction.

In this state, an electrical continuity test, such as a burn-in test, is performed on the IC package 11, and the like.

Figure 15:
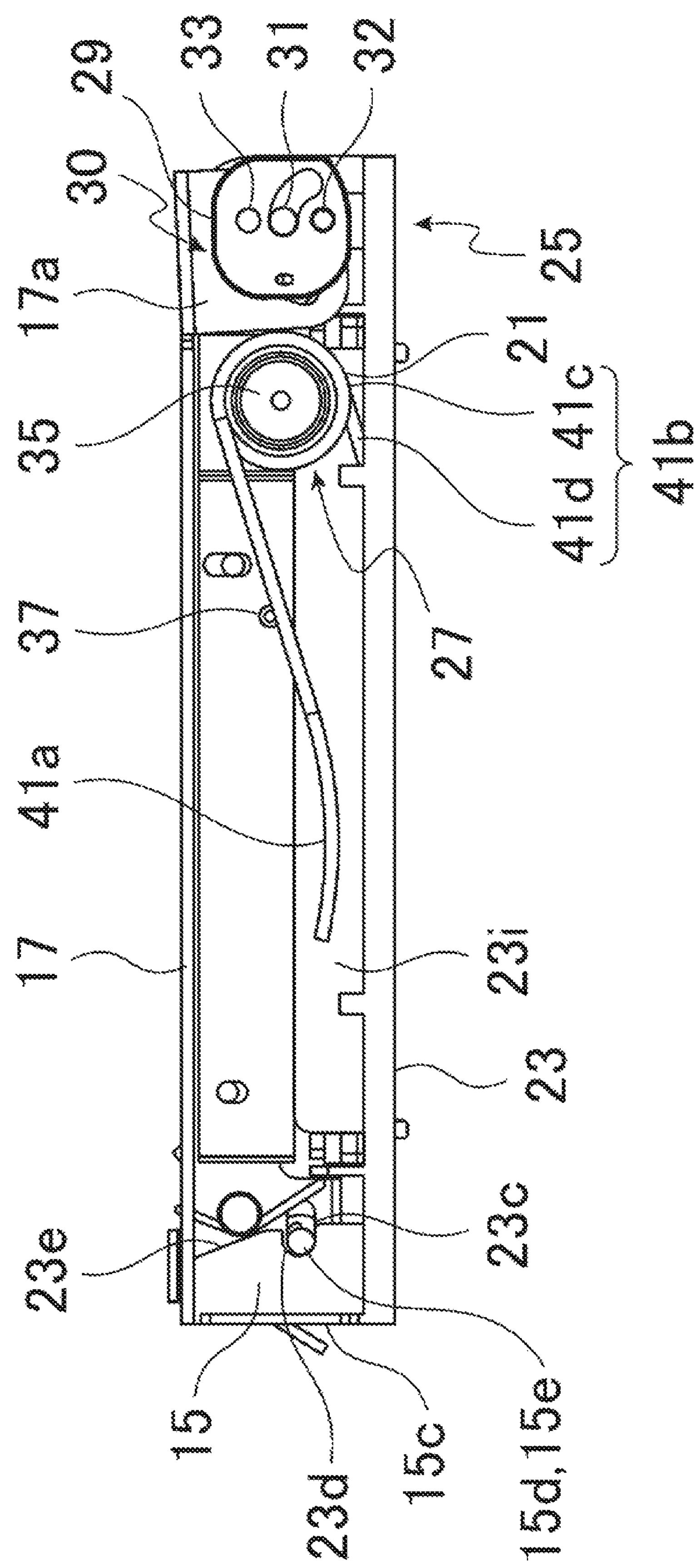
FIG. 15 is a diagram explaining an operation of the biasing means of an IC socket according to the embodiment of the present invention, and shows the state that the cover member is fully closed.

In order to take out the IC package 11 from the IC socket 10, the locking between the shaft 15*e* of the movable supported portion 15*d* of the cover member 15 and the distal end support portion 23*c* of the base portion 23 are released as shown in FIG. 16, from the state that the cover member 15 is fully closed as shown in FIG. 15.

As shown in FIG. 16, when the lever member 17 is rotated in the direction of opening, since the cover member 15 is biased in the direction of opening with respect to the base portion 23 by the biasing means 27, the cover member 15 is rotated in the direction of opening by the biasing force loaded from the spring extending portion 41*a* of the spring member 21.

In this case, since the spring support portion 35 is provided spaced from the rotation shaft that serves as the rotation center of the cover member 15, the abutting position in the spring extending portion 41*a* abutting with the spring receiver 37 of the cover member 15 changes. Specifically, the distance from the spring base portion 41*b* of the spring member 21 to the abutting position in the spring extending portion 41*a* abutting with the spring receiver 37 increases in accordance with the rotation of the cover member 15. Therefore, the spring member 21 reduces the biasing force that rotates the cover member 15 in the direction of lifting and opening the cover member 15.

Figure 17:
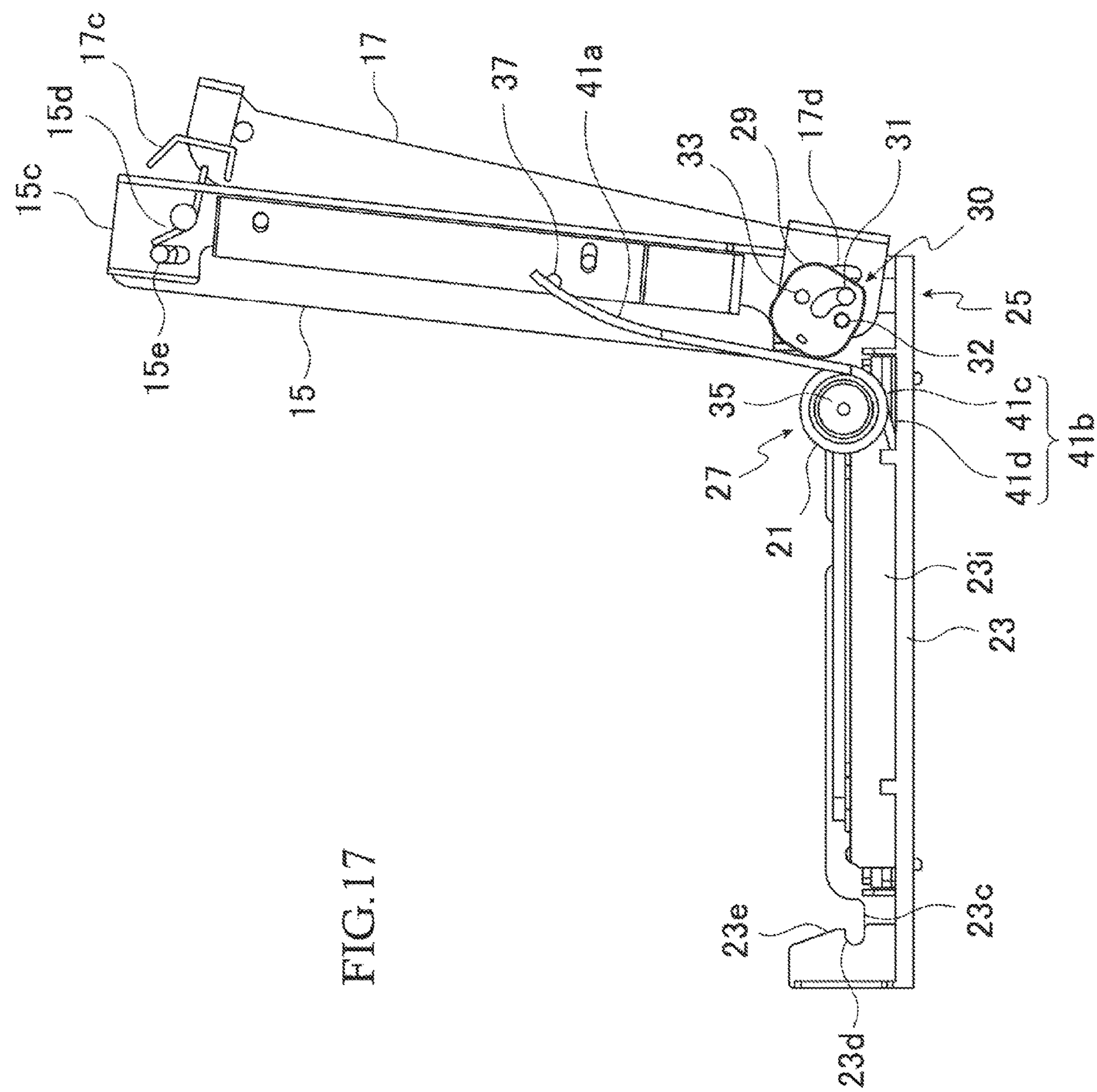
FIG. 17 is a diagram explaining an operation of the biasing means of an IC socket according to the embodiment of the present invention, and shows the state that the cover member is fully opened.

As shown in FIG. 17, while the cover member 15 is opened to the fully open position, the biasing force is reduced inversely proportional to the degree of opening of the cover member 15, and while the cover member 15 is rotated in the direction in which the cover member 15 opens and fully opens, the IC package 11 can be taken out from the socket body 13.

According to the opening/closing mechanism of the IC socket 10 according to the present embodiment, the lever member 17 supported pivotally on the socket body 13 by the first shaft 31 and the cover member 15 are mounted to the link plate 29 by the second shaft 32 and the third shaft 33, and if the lever member 17 is rotated in the direction of closing, the link plate 29 operates so that the cover member 15 is pushed down.

Thus, the force received by the cover member 15 is loaded to the lever member 17 through the link plates 29, and the force loaded to the lever member 17 can be reduced by properly adjusting the arrangement of the link plates 29 and the second and third shafts 32, 33.

Accordingly, even if the force received from the socket body 13 side to the cover member 15 is increased, the cover member 15 can be easily pushed down by the lever member 17 and the operability of the lever member 17 can be improved.

According to the opening/closing mechanism of the IC socket 10 of the present embodiment, the third shaft 33 for mounting the cover member 15 to the link plate 29 is vertically movably supported on the base portion 23 of the socket body 13, so that the cover member 15 can be directly connected to the socket body 13 and raised and lowered at the predetermine position. Accordingly, the cover member 15 can be opened and closed in the predetermined position with respect to the socket body 13 to raise and lower the cover member 15.

According to the opening/closing mechanism of the IC socket 10 according to the present embodiment, the second shaft 32 is disposed lateral one side with respect to the first shaft 31 at the state that the lever member 17 is open, and the second shaft 32 moves below the first shaft 31 by rotating the lever member 17 to the closing direction about the first shaft center of the first shaft 31. Thus, when an upward force is loaded to the cover member 15, this upward force is transferred to the second shaft 32 via the third shaft33 and the link plate 29. While the second shaft 32 is positioned laterally with respect to the first shaft 31, the upward force is loaded to open the lever member 17 in the opening direction and it is necessary to operate the lever member 17 against this upward force. However, if the lever member 17 is rotated around the first shaft 31 and the second shaft 32 is moved below the first shaft31, the upward force from the cover member 15 is more supported on the first shaft 31, thereby reducing the force loaded in the direction of opening the lever member 17. Therefore, by rotating more in the closing direction, the force for operating the lever member 17 can be reduced.

In particular, in the opening/closing mechanism of the IC socket 10 of this embodiment, the second shaft center of the second shaft 32 moves beyond right below the first shaft center of the first shaft 31 from the lateral one side of the first shaft center of the first shaft 31 to the lateral other side of the first shaft center of the first shaft 31. Therefore, when the lever member 17 is rotated in the closing direction and exceeds right below the first shaft center, the upward force from the cover member 15 is loaded on the opposite side of the link plate 29 beyond the first shaft center. Then, the link plate 29 is loaded to rotate in the opposite direction to bias the lever member 17 in the closing direction. As a result, the lever member 17 rotated to close the cover member 15 is loaded with a force in the closing direction, thereby allowing that as if the lever member 17 would be locked.

According to the opening/closing mechanism of the IC socket 10 of the present embodiment, since a plurality of link plates 29 are provided and the lever member 17 is disposed between the plurality of link plates 29, the force received by the cover member 15 is transmitted to the link plates 29 on both sides of the lever member 17, and the lever member 17 is loaded balanced from the link plates 29 on both sides. Therefore, even if a large force is loaded from the cover member 15, the lever member 17 can be operated smoothly and operability can be ensured.

In addition, the lever member 17 is disposed between the plurality of the link plates 29, the first shaft 31 is passed through the first escape hole 29*a* of the plurality of the link plates 29, and the third shaft 33 is passed through the third escape hole 17*d* of the lever member 17. Thus, the plurality of link plates 29 and the lever member 17 are combined to form a structure which secures strength by mutually reinforcing. Therefore, even if a large force is loaded from the cover member 15, deformation, etc. is difficult to occur, and the operability of the lever member 17 can be ensured.

In particular, in the opening/closing mechanism of the IC socket 10 of this embodiment, the socket body 13 includes a plurality of base connection pieces 23*a*, and the plurality of link plates 29 and the lever member 17 are disposed between the plurality of base connection pieces 23*a* and the first shaft 31 is bridged between the plurality of base connection pieces 23*a*. Therefore, the plurality of link plates 29 and lever member 17 can be stably supported, and stable operation is possible even if a large force is loaded from the cover member 15.

According to the opening/closing mechanism of the IC socket 10 of the present embodiment, the spring member 21 that biases the cover member 15 in the direction of opening has the spring extending portion 41*a* extending from the spring base portion 41*b*, the spring support portion 35 that supports the spring base portion 41*b* is provided on the base portion 23, and the spring receiver 37 that abuts the spring extending portion 41*a* is provided on the cover member 15.

Accordingly, the cover member 15 is biased in the direction of opening of the cover member 15 by the biasing force corresponding to the distance from the spring base portion 41*b* of the spring member 21 to the abutting position in the spring extending portion 41*a* abutting with the spring receiver 37. In this embodiment, the distance from the spring base portion 41*b* of the spring member 21 to the abutting position in the spring extending portion 41*a* abutting with the spring receiver 37 increases in accordance with the opening of the cover member 15. Therefore, the spring member 21 reduces the biasing force as the cover member 15 opens more, and the cover member 15 can be biased by the spring member 21 in according with the degree of opening of the cover member 15.

As a result, when the IC package 11 is mounted or dismounted, at the beginning of opening of the cover member 15, the distance from the spring base portion 41*b* to the abutting position in the spring extending portion 41*a* abutting with the spring receiver 37 is short and the biasing force can be strengthened. Therefore, even if the center of gravity of the cover member 15 is far from the third shaft 33 as the rotating shaft, the cover member 15 can be rotated in the direction in which the cover member 15 is easily opened.

On the other hand, when the cover member 15 is raised by a large opening, the distance from the spring base portion 41*b* to the abutting position in the spring extending portion 41*a* with the spring receiver 37 becomes long and the biasing force decreases, and since the center of gravity of the cover member 15 approaches the third shaft 33 as the rotating shaft, the cover member 15 can be rotated in a direction in which the cover member 15 is easily opened. When the cover member 15 is stopped in the fully opened state, the biasing force is reduced and the impact at the stop position can be greatly reduced.

In the opening/closing mechanism of the IC socket 10 according to the present embodiment, since the spring member 21 is a screw coil spring, by disposing the spring base portion 41*b* composed of the coil portion 41*c* and the fixing portion 41*d* on the third shaft 33 side, it is easy for the spring extending portion 41*a* of the wire member to be extended long in a direction that is spaced from the third shaft 33, so that the biasing force at the time of opening/closing of the cover member 15 is easily changed significantly.

In the opening/closing mechanism of the IC socket 10 according to the present embodiment, the spring member 21 is disposed on the side surface of the base member 23 and the cover member 15. Therefore, even if the spring extending portion 41*a* of the spring member 21 is provided in a long length, the spring extending portion 41*a* can be disposed along the base member 23 and the cover member 15 without providing an additional placement space. Thus, the spring member 21 can be easily disposed along the base member 23 and the cover member 15.

According to the IC socket 10 of the present embodiment, the cover member 15 and the lever member 17 are connected to the same side edge side of the socket body 13, and a pressing means 25 for pushing down the cover member 15 is provided. Thus, a structure to rotatably support the lever member 17 and a structure to rotatably support the cover member 15 can be provided on the same side surface side of the socket body 13, and the cover member 15 can be pushed down by the lever member 17.

This enables to simplify the structure of the side surface side of the socket body opposite to the side surface side that the lever member 17 and the cover member 15 are pivotally supported, and it is possible to make smaller or eliminate such a portion that is disposed to be protruded from the socket body 13. Accordingly, when the cover member 15 is opened, the side surface side that the lever member 17 and the cover member 15 are not supported can be widely opened, so that the IC package 11 can be easily accommodated, and a large IC package 11 can be mounted and used.

According to the IC socket 10 of the present embodiment, the cover member 15 is vertically movably connected to the socket body 13 and is connected to the lever member 17 by the link plate 29 as a link member. Therefore, by closing the lever member 17, the cover member 15 can be easily pushed down to the predetermined position of the socket body 13.

According to the IC socket 10 of the present embodiment, the base connection piece 23*a*, the cover connection piece 15*a* and the lever connection piece 17*a* are arranged in parallel along the rotation direction, and the link plate 29 connecting these pieces 15*a*, 17*a*, and 23*a* is also arranged in parallel with each of the connection pieces 15*a*, 17*a* and 23*a*. Therefore, it is easy to construct compactly a structure for rotatably supporting the lever member 17 and the cover member 15 and a structure for pushing down the cover member 15 on the same side of the socket body 13 by connecting the connection pieces 15*a*, 17*a* and 23*a* closely together.

According to the IC socket 10 of the present embodiment, the link member comprises a link plate 29 disposed between the connection pieces 15*a*, 17*a* and 23*a*, and the link pieces

15_a_, 17_a_ and 23_a_ are connected through the escape hole 29_a_ of the link plate 29. Accordingly, each of the connection pieces 15_a_, 17_a_, 23_a_ and the link plate 29 can be combined to reinforce each other, and sufficient strength can be easily secured even if the structure for rotatably supporting the lever member 17 and the cover member 15 and the structure for pushing down the cover member 15 are compactly provided on the same side of the socket body 13.

According to the IC socket 10 of the present embodiment, the long hole 23_h_ is provided on the socket body 13 to movably support the cover member 15, the third shaft 33 supported by the long hole 23_h_ is provided on the cover member 15, and the cover member 17 is configured to be closed so that the cover member 17 is pushed down along the long hole 23_h_. Therefore, the pushing direction and the amount of pushing down of the cover member 17 can be set by the long hole 23_h_ of the socket body 13, and the pushing direction and the amount of pushing down of the IC package 11 that are pushed down by the cover member can be set. This allows the contact pins 19_a_ of the socket body 13 to be pressed by contacting the terminals of the IC package 11 in an appropriate direction, and more appropriately pushing down the IC package 11 depending on the contact pins 19_a_ and the terminals of the IC package 11 can become possible.

According to the IC socket 10 of the present embodiment, the cover member 15 is movably and rotatably supported in the long hole 23_h_ with the third shaft 33 at the cover proximal end 15_b_, and the cover distal end 15_c_ in the closed state is supported in contact with the distal end support portion 23_c_ of the socket body 13 in the direction of opening. Therefore, when the cover member 15 is closed and the cover distal end 15_c_ is supported to the distal end support portion 23_c_ of the socket body 13, the cover member 15 can be pressed down along the long hole 23_h_ by the lever member 17.

In this case, since the cover distal end 15_c_ is movably supported in contact with the distal end support portion 23_c_ of the socket body 13 in the direction of opening, the cover distal end portion 15_c_ can also be displaced at the distal end support portion 23_c_ when the cover proximal end portion 15_b_ moves down along the long hole 23_h_ in the intersecting direction, thereby allowing the cover member 15 to be easily pushed down along the long hole 23_h_.

According to the IC socket 10 of the present embodiment, since the cover proximal end 15_b_ is coupled to the lever member 17 through the link plate 29 as the link member, the cover proximal end 15_b_ can be easily displaced along the long hole 23_h_ by operation of the lever member 17.

According to the IC socket 10 of the present embodiment, since the long hole 23_h_ is formed in a straight line along the contact direction set in the contact pin 19_a_ of the socket body 13, resistance is difficult to occur when the lever member 17 is pushed down, so that the terminal of the IC package 11 can be easily pressed against the contact pin 19_a_ with sufficient force.

Still, the above embodiment may be modified as appropriate within the scope of the present invention.

For example, in the above-described example, a long hole 23_h_ is provided in a substantially linear fashion. However, the long hole 23_h_ is not particularly limited. For example, as shown in FIG. 12, the long hole 23_h_ may have a guide comprising an inclined portion that is inclined in a direction intersecting the contact direction set on the contact pin 19_a_ of the socket body 13.

In the above-described embodiment, the spring support portion 35 for supporting the spring base portion 41_b_ is disposed in the base portion 23, and the spring receiver 37 for abutting the spring extending portion 41_a_ is disposed in the cover member 15. However, the present invention can be applied without any difference even if the spring support portion 35 for supporting the spring base portion 41_b_ is disposed in the cover member 15 and the spring receiver 37 for abutting the spring extending portion 41_a_ is disposed in the base portion 23.

Further, although the screw coil spring with a wire wound is used in the above-described description, the spring member may be enough if it can change the biasing force by changing the abutting position, and may be another spring member 21, such as a leaf spring.

In addition, in the above-described embodiment, the long hole 23_h_ formed in substantially linear is illustrated as an example. However, it is not particularly limited so. It may be a long hole that is inclined in a direction intersecting the contact direction set on the contact pin 19_a_ of the socket body 13.

In this case, the same effect as that of the above-described embodiment is obtained, and the cover member 15 is pushed down by pushing down the lever member 17, so that the long hole 23_h_ allows the terminal of the IC package 11 to come into contact with the contact pin 19_a_ while moving in the intersecting direction together with the cover member 15.

As a result, by moving the contact pin 19_a_ in contact with the surface of the terminal, the coating or foreign matter present on the surface of the terminal can be removed, and then the contact pin 19_a_ can be strongly contacted, so-called wiping can be performed.

EXPLANATION OF REFERENCE

10 IC socket
11 IC package
13 socket body
15 cover member
15_a_ cover joints
15_b_ cover proximal end
15_c_ cover distal end
15_d_ movable supported portion
15_e_ shaft
17 lever member
17_a_ lever connection piece
17_c_ operation piece
17_d_ third escape hole
19 contact pin unit
19_a_ contact pin
21 spring member
23 base portions
23_a_ base connection piece
23_c_ distal end support portion
23_d_ contact support portion
23_e_ guide portion
23_g_ first support hole
23_h_ long hole
23_i_ front and rear frame piece
25 pressing means
27 biasing means
29 link plate
29_a_ first escape hole
30 rotating link mechanism
31 first shaft
32 second shaft
33 third shaft
35 spring support portion
37 spring receiver
41_a_ spring extending portion

41*b* spring base
41*c* coil portion
41*d* fixing portion

The invention claimed is:

1. An apparatus comprising:

a socket body having an accommodation space to accommodate an electrical component, the socket body having a base portion;

a rotating shaft at a proximal end side of the base portion, a cover member rotatable around the rotating shaft to open and close the accommodation space;

a spring support portion on one of the base portion and the cover member;

a spring receiver on the other of the base portion and the cover member; and a spring member having a spring base portion supported by the spring support portion and a spring extending portion that abuts the spring receiver, and providing a biasing force that biases the cover member toward opening the accommodation space, wherein the spring support portion is spaced apart from the rotating shaft in a direction from a proximal end side of the one of the base portion and the cover member toward a distal end side of the one of the base portion and the cover member so that, as the cover member moves from a position in which the cover member closes the accommodation space to a position in which the cover member opens the accommodation space, an abutment position along the spring extending portion at which the spring extending portion abuts the spring receiver changes, a distance from the spring base portion to the abutment position increases, and the biasing force decreases.

2. The apparatus according to claim 1, wherein the spring member is a screw coil spring, the spring base portion has a coil portion formed by winding a wire having a first end portion and a second end portion, and a fixing portion formed by the first end portion and fixed to the spring support portion, and the spring extending portion formed by the second end portion.

3. The apparatus according to claim 1, wherein the spring member is disposed on a side surface of the base member and the cover member.

4. The apparatus according to claim 1, further comprising:

a contact pin disposed on the socket body, wherein the cover member is configured to, with the electrical component accommodated in the accommodation space, press the electrical component so as to cause the electrical component to contact the contact pin.

5. The apparatus according to claim 1, wherein the spring support portion is at approximately a same height as the rotating shaft with respect to the base portion, the spring support portion is on the base portion, and the spring receiver is on the cover member.

6. A socket comprising:

a socket body having an accommodation space to accommodate an electrical component, the socket body including a base portion and a contact pin;

a rotating shaft at a proximal end side of the base portion, a cover member rotatable around the rotating shaft to open and close the accommodation space;

a spring support portion on one of the base portion and the cover member;

a spring receiver on the other of the base portion and the cover member; and a spring member having a spring base portion supported by the spring support portion and a spring extending portion that abuts the spring receiver, and providing a biasing force that biases the cover member toward opening the accommodation space, wherein the spring support portion is spaced apart from the rotating shaft in a direction from a proximal end side of the one of the base portion and the cover member toward a distal end side of the one of the base portion and the cover member so that, as the cover member moves from a position in which the cover member closes the accommodation space to a position in which the cover member opens the accommodation space, an abutment position along the spring extending portion at which the spring extending portion abuts the spring receiver changes, a distance from the spring base portion to the abutment position increases, and the biasing force decreases, and as the cover member moves from the position in which the cover member opens the accommodation space to the position in which the cover member closes the accommodation space with the electrical component accommodated in the accommodation space, the closing of the cover member causes the electrical component to be pressed, which causes the electrical component to contact the contact pin.

7. The socket according to claim 6, wherein the spring member is a screw coil spring, the spring base portion has a coil portion formed by winding a wire having a first end portion and a second end portion, and a fixing portion formed by the first end portion and fixed to the spring support portion, and the spring extending portion formed by the second end portion.

8. The socket according to claim 6, wherein the spring member is disposed on a side surface of the base member and the cover member.

9. The socket according to claim 6, wherein the spring support portion is at approximately a same height as the rotating shaft with respect to the base portion, the spring support portion is on the base portion, and the spring receiver is on the cover member.

* * * * *